(12) United States Patent
Okamoto et al.

(10) Patent No.: US 7,271,015 B2
(45) Date of Patent: Sep. 18, 2007

(54) MANUFACTURING METHOD OF SEMICONDUCTOR INTEGRATED CIRCUIT DEVICE AND PROBE CARD

(75) Inventors: Masayoshi Okamoto, Kai (JP); Hideyuki Matsumoto, Higashimurayama (JP); Shingo Yorisaki, Hachioji (JP); Akio Hasebe, Kodaira (JP); Yasuhiro Motoyama, Hachioji (JP); Akira Shimase, Yokosuka (JP)

(73) Assignee: Renesas Technology Corp., Tokyo (JP)

( * ) Notice: Subject to any disclaimer, the term of this patent is extended or adjusted under 35 U.S.C. 154(b) by 159 days.

(21) Appl. No.: 11/100,600

(22) Filed: Apr. 7, 2005

(65) Prior Publication Data

US 2005/0227383 A1    Oct. 13, 2005

(30) Foreign Application Priority Data

Apr. 9, 2004   (JP) .............................. 2004-115048

(51) Int. Cl.
*H01L 21/66* (2006.01)
(52) U.S. Cl. .......................................... 438/14; 257/48
(58) Field of Classification Search ................ 438/14; 257/48
See application file for complete search history.

(56) References Cited

U.S. PATENT DOCUMENTS

2002/0106820 A1* 8/2002 Nikawa ....................... 438/14
2004/0238818 A1* 12/2004 Kim ............................ 257/48

FOREIGN PATENT DOCUMENTS

| JP | 05-283490 | 10/1993 |
| JP | 2001-108706 | 4/2001 |
| JP | 2002-014137 | 1/2002 |
| JP | 2002-228682 | 8/2002 |

* cited by examiner

*Primary Examiner*—Thao P. Le
(74) *Attorney, Agent, or Firm*—Antonelli, Terry, Stout & Kraus, LLP.

(57) ABSTRACT

Electrical testing is to be performed on a semiconductor integrated circuit device which the test pads formed. To facilitate such testing, the method of manufacture of the semiconductor integrated circuit device employs a probe card which has two or more contact terminals which can contact two or more electrodes. This probe card includes, in opposition to a wiring substrate of the semiconductor integrated circuit device in which a first wiring is formed, a first sheet having two or more contact terminals to contact the two or more electrodes; a second wiring electrically connected to the two or more contact terminals and the first wiring; and first dummy wirings which are near the region of formation of the two or more contact terminals, are arranged to a non-forming region of the second wiring, and do not participate in signal transfer.

3 Claims, 35 Drawing Sheets

MANUFACTURING METHOD OF SEMICONDUCTOR INTEGRATED CIRCUIT DEVICE AND PROBE CARD

CROSS-REFERENCE TO RELATED APPLICATION

The present application claims priority from Japanese patent application No. 2004-115048, filed on Apr. 9, 2004, the content of which is hereby incorporated by reference into this application.

This invention relates in general to the manufacture of a semiconductor integrated circuit device, and, more particularly, the invention relates to technology that is effective when applied to the electrical testing of a semiconductor integrated circuit in which many electrode pads have been arranged with a narrow pitch.

For example, Japanese Unexamined Patent Publication No. 2002-14137 describes a semiconductor device testing apparatus which has a contact terminal in the shape of two or more pyramids which project towards a semiconductor device for use in the burn-in test of the semiconductor device, which has a projection electrode. And, in contacting a semiconductor device using a semiconductor device testing apparatus by electrically contacting ridgelines or slopes of one or more contact terminals to one projection electrode, it is possible to prevent damage to the projection electrode at the time of contact between the projection electrode and a contact terminal.

As indicated by Japanese Unexamined Patent Publication No. 2002-228682, a probe is held by a support that is used in case the probe is brought into contact with a bump electrode of a semiconductor wafer and an electrical property of the semiconductor device is inspected. The probe is provided with a first contact terminal for applying a voltage to the bump electrode of a semiconductor wafer, a first insulating member surrounding the first contact terminal, a second contact terminal for surrounding the first insulating member and for detecting a voltage via a bump electrode, and a second insulating member which intervenes between the first and second contact terminals. And, by being equipped with the first and second coil springs which intervene between the first and second terminal parts in the first and second contact terminals, respectively, even when the size of the bump electrode is minimized, it is possible to prevent the probe from separating from the bump electrode.

As indicated by Japanese Unexamined Patent Publication No. Hei 5(1993)-283490, by contacting the connection end of the needle of a probe to the bump electrode of each integrated circuit device formed in a semiconductor wafer, an integrated circuit device is electrically connected to a testing and measuring apparatus. By pressing the bump electrode of the next integrated circuit device in a wafer, changing the tip part, and arranging the height by means of a pressing body, the integrated circuit device to which the height of the bump electrode was equal is connected to a testing and measuring apparatus by uniform contact resistance via a probe means, whereby the examination accuracy is improved, and, also in the case of an integrated circuit device that is mounted, the technology makes it possible to decrease the variation in the connection resistance between the mounting sides.

As indicated by Japanese Unexamined Patent Publication No. 2001-108706, in a contactor that is used in case two or more solder balls formed in the semiconductor wafer and two or more probes corresponding to these are brought into mutual contact, respectively, a signal is transmitted and received between the tester sides, and the electrical property testing of a wafer is conducted. By providing a probe in which the cylinder part makes contact outside of the center of a ball-like solder ball in the state in which electricity can flow freely at a contact end, even if the probe contacts the solder ball, the damage of the central part of a solder ball is prevented, with the result that the reflow process of a solder ball can be skipped.

[Patent Reference 1] Japanese Unexamined Patent Publication No. 2002-14137

[Patent Reference 2] Japanese Unexamined Patent Publication No. 2002-228682

[Patent Reference 3] Japanese Unexamined Patent Publication No. Hei 5(1993)-283490

[Patent Reference 4] Japanese Unexamined Patent Publication No. 2001-108706

SUMMARY OF THE INVENTION

In the testing of a semiconductor integrated circuit device, probe testing may be employed, for example. This probe testing includes a functional test which checks to determine whether the device operates to perform a predetermined function, and the test which judges whether the device is defective or non-defective is a test of the DC operating characteristic and the AC operating characteristic.

In order to reduce the cost of manufacture of a semiconductor integrated circuit device, the semiconductor device and it wirings are very detailed, the area of a semiconductor chip (also simply called a "chip") is made small, and an increased number of acquisition chips per wafer is provided. Therefore, the number of test pads (bump electrode) not only increases, but the arrangement of a test pad provides a narrow pitch, and the area of a test pad is reduced. When a prober is used which has cantilever type probing needles for the above-mentioned probe testing in which the test pad has a narrow pitch, a problem exists in that it becomes difficult to install probing needles according to the specific location of a test pad.

Upon probe testing using a prober with cantilever type probes, the probes are wiped on the surface of the test pads in order to tear the natural oxide film that has formed over the surface of each of the test pads and thereby bring the probe into electrical contact with the corresponding test pad. Wiping of the probes not only breaks the natural oxide film formed over the surface of each test pad, but also forms a dent on the surface of the test pad. Since the area of the test pads is narrow, as described above, such a dent occupies a large portion of the surface of each test pad. This leads to a problem in that the adhesive force of a bonding wire connected to the test pad in a later step is inevitably reduced. There is also a fear that, as the area of the test pad decreases, the tip portion of the probe may deviate from the test pad and a short-circuit may occur between two adjacent test pads.

In addition, wiping of the probe on the surface of the test pad shaves off a portion of the test pad and the shavings thus generated adhere to the tip portion of the probe. The shavings adhere to the tip portion of the probe and build up due to the repetition of probing, which finally disturbs the electrical connection between the probe and the test pad. After probing is conducted a predetermined number of times, the probe should be cleaned by rubbing the tip portion of the probe with a certain cleaning sheet. The inevitable addition of this cleaning step prolongs the probe testing step, which also prolongs the fabrication time of the semiconductor integrated circuit device, resulting in such a problem in that the production cost of the semiconductor integrated circuit device rises.

As described above, it has become difficult to perform probe testing owing to an increase in the number of test pads and a narrowing of the pitch between the test pads. The present inventors therefore have investigated testing using a prober, as shown in FIG. 59, having a wiring substrate 102 equipped with cantilever type probes 101 that are brought into contact with bump electrodes over the main surface of a chip.

FIG. 60 is an enlarged plan view of a region A in FIG. 59 showing probe testing, and FIG. 61 is a sectional view illustrating a substantial part of the cross-section taken along a line C-C of FIG. 60. In the region A, the extending direction of the bump electrode 103 is almost the same as the extending direction of the probe 101. The probe 101 therefore wipes in the extending direction (shown by an arrow in FIGS. 60 and 61) of the bump electrode 103 after contact with the bump electrode 103 (refer to FIGS. 62 and 63). FIG. 64 is an enlarged plan view of a region B in FIG. 59 showing the probe testing step, and FIG. 65 is an enlarged sectional view illustrating a substantial part of the cross-section taken along a line D-D in FIG. 64. In the region B, the extending direction of the bump electrode 103 intersects with the extending direction of the probe 101. The probe 101 therefore wipes (overdrives) in the direction (shown by an arrow in FIGS. 64 and 65) intersecting with the extending direction of the bump electrode 103 after contact with the bump electrode 103 (refer to FIGS. 66 and 67). Therefore, there is a fear that, after the wiping of the probe 101, the tip portion of the probe 101 will deviate from the bump electrode 103 and a short-circuit may occur between the bump electrodes 103 caused by the probe 101.

At present, a method of reducing the number of test pads to be brought into contact with the probes has been investigated utilizing DFT (Design For Testability) technology or BIST (Built In Self Test) technology. Use of DFT (Design for Testability) technology or BIST (Built In Self Test) technology, however, requires the provision of new test pads. For the purpose of preventing elements or wirings from being damaged by the impact upon contact of the probe with the test pad, the test pad is disposed in an input/output region having neither elements nor wirings formed therebelow. With an increase in the speed of operation of a semiconductor integrated circuit device, on the other hand, there is a growing need for disposal of a large number of power supply pads in their input/output regions in order to reduce noise (to reduce source impedance). In a chip of limited size, the size of each input/output region is also limited. Disposal of power supply pads, therefore, makes it difficult to maintain a region for the disposal of the above-described test pad used for DFT technology or BIST technology.

The object of this invention is to offer a technique in which it is possible to perform electrical testing of a semiconductor integrated circuit device which has test pads formed with a narrow pitch.

The above and the other objects and features of this invention will become clear from the following description and the accompanying drawings.

An outline of typical aspects of the present invention, as described in the present application, will be briefly explained.

<<1>> A manufacturing method of a semiconductor integrated circuit device, which comprises the steps of:
(a) preparing a semiconductor wafer which has been divided in two or more chip regions each having a semiconductor integrated circuit formed thereover, and has, formed over the main surface of the wafer, two or more electrodes to be electrically connected to the semiconductor integrated circuit;
(b) preparing a probe card which has two or more contact terminals which can contact the two or more electrodes; and
(c) conducting electrical testing of the semiconductor integrated circuit, tips of the two or more contact terminals being contacted to the two or more electrodes;
wherein the step (b) comprises the steps of:
(b1) preparing, as opposed to a wiring substrate in which a first wiring is formed, a first sheet having the two or more contact terminals to contact the two or more electrodes; a second wiring electrically connected to the two or more contact terminals and the first wiring; and first dummy wirings which are near the formation domain of the two or more contact terminals, are arranged to a non-forming domain of the second wiring, and do not participate in signal transfer; and
(b2) after the step (b1), attaching the first sheet over the wiring substrate in a state that a domain in which the two or more contact terminals are formed of the first sheet, can be pressed from a back of the first sheet (This step may be skipped).

<<2>> The manufacturing method of a semiconductor integrated circuit device according to Item 1, wherein
the two or more electrodes are arranged in two or more sequences along with the perimeter of the chip region; and
the electrode contained in the first sequence and the electrode contained in the second sequence are alternately arranged in the direction in alignment with the perimeter of the chip region.

<<3>> The manufacturing method of a semiconductor integrated circuit device according to Item 2, wherein
the dummy wirings include a wiring formed in a shape of radiation toward a part corresponding to the electrode array part from a central part of the first sheet.

<<4>> A manufacturing method of a semiconductor integrated circuit device, which comprises the steps of:
(a) preparing a semiconductor wafer which has been divided in two or more chip regions each having a semiconductor integrated circuit formed thereover, and has, formed over the main surface of the wafer, two or more electrodes to be electrically connected to the semiconductor integrated circuit;
(b) preparing a probe card which has two or more contact terminals which can contact the two or more electrodes; and
(c) conducting electrical testing of the semiconductor integrated circuit, tips of the two or more contact terminals being contacted to the two or more electrodes;
wherein the step (b) comprises the steps of:
(b1) preparing, as opposed to a wiring substrate in which a first wiring is formed, a first sheet having the two or more contact terminals to contact the two or more electrodes; a second wiring electrically connected to the two or more contact terminals and the first wiring; and a metal wiring for a shield formed along a signal wire which is easy to be influenced by a noise among the second wirings; and
(b2) after the step (b1), attaching the first sheet over the wiring substrate in a state that a domain in which the two or more contact terminals are formed of the first sheet, can be pressed from a back of the first sheet (This step may be skipped).

<<5>> The manufacturing method of a semiconductor integrated circuit device according to Item 4, wherein the metal wiring for a shield is fixed to a grand level.

<<6>> The manufacturing method of a semiconductor integrated circuit device according to Item 5, wherein the signal wire which is easy to be influenced by a noise among the second wirings is shielded so that the signal wire may be put between two or more metal wiring for a shield of the same wiring layer as the signal wire.

<<7>> The manufacturing method of a semiconductor integrated circuit device according to Item 5, wherein the signal wire which is easy to be influenced by a noise among the second wirings is shielded by the metal wiring for a shield formed in an upper layer or a lower layer.

<<8>> The manufacturing method of a semiconductor integrated circuit device according to Item 7, wherein the metal wiring for a shield is formed more widely than a width of the signal wire which is easy to be influenced by a noise.

<<9>> A manufacturing method of a semiconductor integrated circuit device, which comprises the steps of:

(a) preparing a semiconductor wafer which has been divided in two or more chip regions each having a semiconductor integrated circuit formed thereover, and has, formed over the main surface of the wafer, two or more electrodes to be electrically connected to the semiconductor integrated circuit;

(b) preparing a probe card which has two or more contact terminals which can contact the two or more electrodes; and (c) conducting electrical testing of the semiconductor integrated circuit, tips of the two or more contact terminals being contacted to the two or more electrodes;

wherein the step (b) comprises the steps of:

(b1) positioning, as opposed to a wiring substrate in which a first wiring is formed, based on a mark for positioning a first sheet having the two or more contact terminals to contact the two or more electrodes; a second wiring electrically connected to the two or more contact terminals and the first wiring; and a pattern with which a screw hole through which a screw can penetrate and the mark for positioning are formed; and (b2) after the step (b1), attaching the first sheet over the wiring substrate in a state that a domain in which the two or more contact terminals are formed of the first sheet, can be pressed from a back of the first sheet (This step may be skipped).

<<10>> The manufacturing method of a semiconductor integrated circuit device according to Item 9, wherein the second wiring is formed in a shape of radiation toward a perimeter from a central part of the first sheet, and the second dummy wiring which does not participate in signal transfer is formed in the gap.

<<11>> A manufacturing method of a semiconductor integrated circuit device, which comprises the steps of:

(a) preparing a semiconductor wafer which has been divided in two or more chip regions each having a semiconductor integrated circuit formed thereover, and has, formed over the main surface of the wafer, two or more electrodes to be electrically connected to the semiconductor integrated circuit;

(b) preparing a probe card which has two or more contact terminals which can contact the two or more electrodes; and (c) conducting electrical testing of the semiconductor integrated circuit, tips of the two or more contact terminals being contacted to the two or more electrodes;

wherein the step (b) comprises the steps of:

(b1) sticking a second sheet made of invar over the back of a domain in which the two or more contact terminals are formed in a first sheet including the two or more contact terminals for making the two or more electrodes contact, and a second wiring electrically connected to the two or more contact terminals;

(b2) providing a first elastomer in a position corresponding to a formation position of the two or more contact terminals so that the second sheet may be penetrated;

(b3) forming in a circumference of the first elastomer a second elastomer which can secure flatness of roots of the two or more contact terminals in case the two or more contact terminals are pressed via the first elastomer; and (b4) after the step (b3), attaching the first sheet over the wiring substrate in a state that a domain in which the two or more contact terminals are formed of the first sheet, can be pressed from a back (This step may be skipped).

<<12>> The manufacturing method of a semiconductor integrated circuit device according to Item 11, wherein the invar contains 42 Alloy as main ingredient.

<<13>> The manufacturing method of a semiconductor integrated circuit device according to Item 11, wherein tension concerning the first sheet is adjusted by a cross-section area of the second elastomer.

<<14>> The manufacturing method of a semiconductor integrated circuit device according to Item 11, wherein the tension concerning the first sheet is adjusted by a number which forms the second elastomer.

<<15>> A manufacturing method of a semiconductor integrated circuit device, which comprises the steps of:

(a) preparing a semiconductor wafer which has been divided in two or more chip regions each having a semiconductor integrated circuit formed thereover, and has, formed over the main surface of the wafer, two or more electrodes to be electrically connected to the semiconductor integrated circuit;

(b) preparing a probe card which has two or more contact terminals which can contact the two or more electrodes; and (c) conducting electrical testing of the semiconductor integrated circuit, tips of the two or more contact terminals being contacted to the two or more electrodes;

wherein the step (b) comprises the steps of:

(b1) preparing, as opposed to a wiring substrate in which a first wiring is formed, a first sheet having the two or more contact terminals to contact the two or more electrodes; a second wiring electrically connected to the two or more contact terminals and the first wiring; a contact part with a first ring; and a contact part with a second ring which has a diameter smaller than the first ring, wherein a through-hole for connecting wirings between different wiring layers at the outside of a contact part with the first ring or at the inside of a contact part with the second ring is formed; and (b2) after the step (b1), attaching the first sheet over the wiring substrate in a state that a domain in which the two or more contact terminals are formed of the first sheet, can be pressed from a back of the first sheet (This step may be skipped).

<<16>> The manufacturing method of a semiconductor integrated circuit device according to Item 15, wherein two or more through-holes are formed in a joint part of wirings between the different wiring layers.

<<17>> A manufacturing method of a semiconductor integrated circuit device, which comprises the steps of:

(a) preparing a semiconductor wafer which has been divided in two or more chip regions each having a semiconductor integrated circuit formed thereover, and has, formed over the main surface of the wafer, two or more electrodes to be electrically connected to the semiconductor integrated circuit;

(b) preparing a probe card which has two or more contact terminals which can contact the two or more electrodes; and (c) conducting electrical testing of the semiconductor integrated circuit, tips of the two or more contact terminals being contacted to the two or more electrodes;

wherein the step (b) comprises the steps of:

(b1) preparing, as opposed to a wiring substrate in which a first wiring is formed, a first sheet having the two or more contact terminals to contact the two or more electrodes; a second wiring electrically connected to the two or more contact terminals and the first wiring; and an electric circuit including a passive component which is formed near the two or more contact terminals, and is connected to the second wiring; and (b2) after the step (b1), attaching the first sheet over the wiring substrate in a state that a domain in which the two or more contact terminals are formed of the first sheet, can be pressed from a back of the first sheet (This step may be skipped).

<<18>> The manufacturing method of a semiconductor integrated circuit device according to Item 17, wherein at least one of a resistance, an inductor, and a capacitor is included in the passive component.

<<19>> The manufacturing method of a semiconductor integrated circuit device according to Item 17, wherein an impedance adjustment circuit for making adjust an impedance of a signal transfer system is included in the electric circuit.

<<20>> A manufacturing method of a semiconductor integrated circuit device, which comprises the steps of:

(a) preparing a semiconductor wafer which has been divided in two or more chip regions each having a semiconductor integrated circuit formed thereover, and has, formed over the main surface of the wafer, two or more electrodes to be electrically connected to the semiconductor integrated circuit;

(b) preparing a probe card which has two or more contact terminals which can contact the two or more electrodes; and (c) conducting electrical testing of the semiconductor integrated circuit, tips of the two or more contact terminals being contacted to the two or more electrodes;

wherein the step (b) comprises the steps of:

(b1) preparing a first sheet having the two or more contact terminals for making the two or more electrodes contact, and a second wiring for connecting the contact terminals to a pressure welding land electrically, as opposed to a wiring substrate having the pressure welding land, a pogo-seat for enabling an exchange of various signals with an exterior in the step (c), and a first wiring for connecting regularly the pressure welding land and the pogo-seat; and (b2) after the step (b1), attaching the first sheet over the wiring substrate in a state that a domain in which the two or more contact terminals are formed of the first sheet, can be pressed from a back of the first sheet (This step may be skipped).

<<21>> The manufacturing method of a semiconductor integrated circuit device according to Item 20, wherein an arrangement of the pressure welding land and the pogo-seat in the step (b1) is made to correspond to an arrangement of the two or more electrodes in the semiconductor wafer.

<<22>> The manufacturing method of a semiconductor integrated circuit device according to Item 21, wherein the wiring substrate contains glass epoxy as main ingredient.

<<23>> A manufacturing method of a semiconductor integrated circuit device, which comprises the steps of:

(a) preparing a semiconductor wafer which has been divided in two or more chip regions each having a semiconductor integrated circuit formed thereover, and has, formed over the main surface of the wafer, two or more electrodes to be electrically connected to the semiconductor integrated circuit;

(b) preparing a probe card which has two or more contact terminals which can contact the two or more electrodes; and (c) conducting electrical testing of the semiconductor integrated circuit, tips of the two or more contact terminals being contacted to the two or more electrodes;

wherein the step (b) comprises the steps of:

(b1) preparing, as opposed to a wiring substrate in which a first wiring is formed, a first sheet wherein the two or more contact terminals for making the two or more electrodes contact, and a second wiring electrically connected to the two or more contact terminals and the first wiring are plurally formed corresponding to the two or more divided chip regions; and (b2) after the step (b1), attaching the first sheet over the wiring substrate in a state that a domain in which the two or more contact terminals are formed of the first sheet, can be pressed from a back of the first sheet (This step may be skipped).

<<24>> A probe card, which comprises:

(a) a wiring substrate having a pressure welding land; a pogo-seat for enabling an exchange of a signal with an external device; and a first wiring for carrying out an electrical connection of the pressure welding land and the pogo-seat;

(b) a first sheet having two or more contact terminals which can contact two or more electrodes formed in a main surface of a semiconductor wafer; a second wiring which can connect electrically the two or more contact terminals and the pressure welding land; and a first dummy wiring which is near a formation domain of two or more contact terminals, is arranged to a non-forming domain of the second wiring, and does not participate in signal transfer;

(c) a first ring for attaching the first sheet over the wiring substrate; and (d) a pressing mechanism which is supported by the wiring substrate, and can be pressed from the back of the first sheet about the domain in which the two or more contact terminals are formed in the first sheet.

<<25>> A probe card, which comprises:

(a) a wiring substrate having a pressure welding land; a pogo-seat for enabling an exchange of a signal with an external device; and a first wiring for carrying out an electrical connection of the pressure welding land and the pogo-seat;

(b) a first sheet having two or more contact terminals which can contact two or more electrodes formed in a main surface of a semiconductor wafer; a second wiring which can connect electrically the two or more contact terminals and the pressure welding land; and a metal wiring for a shield formed along a signal wire which is easy to be influenced by a noise among the second wirings;

(c) a first ring for attaching the first sheet over the wiring substrate; and (d) a pressing mechanism which is supported by the wiring substrate, and can be pressed from the back of the first sheet about the domain in which the two or more contact terminals are formed in the first sheet.

<<26>> A probe card, which comprises:

(a) a wiring substrate having a pressure welding land; a pogo-seat for enabling an exchange of a signal with an external device; and a first wiring for carrying out an electrical connection of the pressure welding land and the pogo-seat;

(b) a first sheet having two or more contact terminals which can contact two or more electrodes formed in a main surface of a semiconductor wafer; a second wiring which can connect electrically the two or more contact terminals and the pressure welding land; and a pattern with which a screw hole through which a screw can penetrate and the mark for positioning are formed;

(c) a first ring for carrying out a screw stop of the first sheet to the wiring substrate, where the first sheet is positioned by a mark for positioning; and (d) a pressing mechanism which is supported by the wiring substrate, and can be pressed from the back about the domain in which the two or more contact terminals are formed in the first sheet.

<<27>> A probe card, which comprises:

(a) a wiring substrate having a pressure welding land; a pogo-seat for enabling an exchange of a signal with an external device; and a first wiring for carrying out an electrical connection of the pressure welding land and the pogo-seat;

(b) a first sheet having two or more contact terminals which can contact two or more electrodes formed in a main surface of a semiconductor wafer; and a second wiring which can connect electrically the two or more contact terminals and the pressure welding land;

(c) a second sheet made of invar stuck over a back of a domain in which the two or more contact terminals are formed in the first sheet;

(d) a first elastomer provided in a position corresponding to a formation position of the two or more contact terminals so that the second sheet may be penetrated;

(e) a second elastomer which is formed in a circumference of the first elastomer, and can secure flatness of roots of the two or more contact terminals in case the two or more contact terminals are pressed via the first elastomer;

(f) a first ring for attaching the first sheet over the wiring substrate; and (g) a pressing mechanism which is supported by the wiring substrate, and can be pressed from the back of the first sheet about the domain in which the two or more contact terminals are formed in the first sheet.

<<28>> A probe card, which comprises:

(a) a wiring substrate having a pressure welding land; a pogo-seat for enabling an exchange of a signal with an external device; and a first wiring for carrying out an electrical connection of the pressure welding land and the pogo-seat;

(b) a first sheet having two or more contact terminals which can contact two or more electrodes formed in a main surface of a semiconductor wafer; a second wiring which can connect electrically the two or more contact terminals and the pressure welding land; a contact part with a first ring; and a contact part with a second ring which has a diameter smaller than the first ring, wherein a through-hole for connecting wirings between different wiring layers at the outside of a contact part with the first ring or at the inside of a contact part with the second ring is formed;

(c) a first ring for attaching the first sheet over the wiring substrate; and (d) a pressing mechanism which is supported by the wiring substrate, and can be pressed from the back of the first sheet about the domain in which the two or more contact terminals are formed in the first sheet.

<<29>> A probe card, which comprises:

(a) a wiring substrate having a pressure welding land; a pogo-seat for enabling an exchange of a signal with an external device; and a first wiring for carrying out an electrical connection of the pressure welding land and the pogo-seat;

(b) a first sheet having two or more contact terminals which can contact two or more electrodes formed in a main surface of a semiconductor wafer; a second wiring which can connect electrically the two or more contact terminals and the pressure welding land; and an electric circuit including a passive component which is formed near the two or more contact terminals, and is connected to the second wiring;

(c) a first ring for attaching the first sheet over the wiring substrate; and (d) a pressing mechanism which is supported by the wiring substrate, and can be pressed from the back of the first sheet about the domain in which the two or more contact terminals are formed in the first sheet.

<<30>> A probe card, which comprises:

(a) a wiring substrate having a pressure welding land; a pogo-seat for enabling an exchange of a signal with an external device; and a first wiring for carrying out an electrical connection of the pressure welding land and the pogo-seat;

(b) a first sheet having two or more contact terminals which can contact two or more electrodes formed in a main surface of a semiconductor wafer; and a second wiring which can connect electrically the two or more contact terminals and the pressure welding land;

(c) a first ring for attaching the first sheet over the wiring substrate; and (d) a pressing mechanism which is supported by the wiring substrate, and can be pressed from the back of the first sheet about the domain in which the two or more contact terminals are formed in the first sheet.

<<31>> A probe card, which comprises:

(a) a wiring substrate having a pressure welding land; a pogo-seat for enabling an exchange of a signal with an external device; and a first wiring for carrying out an electrical connection of the pressure welding land and the pogo-seat;

(b) a first sheet wherein two or more contact terminals which can contact two or more electrodes in the semiconductor wafer with which the two or more electrodes are formed on a main surface while being divided in two or more chip regions, and a second wiring electrically connectable the two or more contact terminals and the pressure welding land are plurally formed corresponding to the two or more divided chip regions;

(c) a first ring for attaching the first sheet over the wiring substrate; and (d) a pressing mechanism which is supported by the wiring substrate, and can be pressed from the back of the first sheet about the domain in which the two or more contact terminals are formed in the first sheet.

It will be as follows if the effect acquired by the typical thing among the inventions indicated in the present application is explained briefly.

That is, electrical testing (probe testing) to the semiconductor integrated circuit device which has the test pads formed into the narrow pitch can be carried out.

DETAILED DESCRIPTION OF THE PREFERRED EMBODIMENTS

Figure 1:
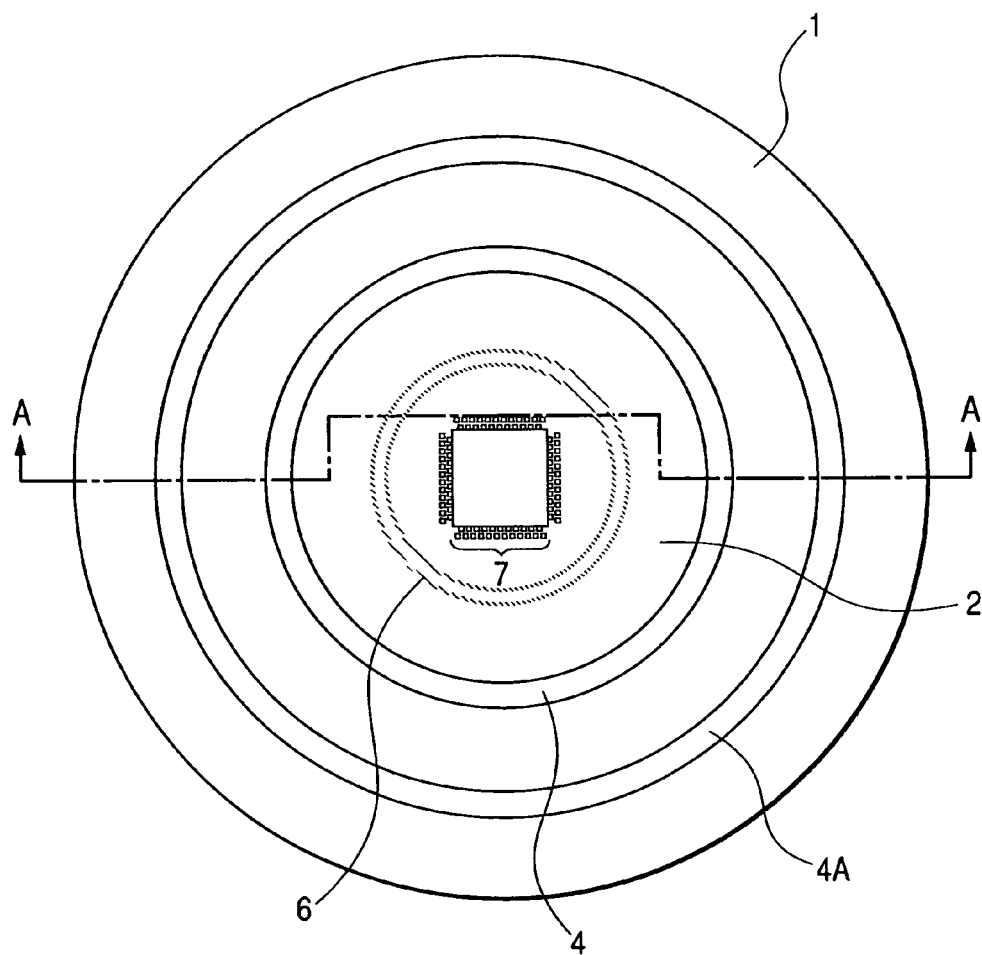
FIG. 1 is a plan view of the undersurface of the probe card of Embodiment 1 of the invention.

Prior to a detailed description of the invention, the meanings of certain terms used herein will be described.

The term "wafer" means a single crystal silicon substrate (usually having a substantially flat disk form), an SOI (Silicon On Insulator) substrate, a sapphire substrate, a glass substrate, or any other insulating, semi-insulating or semiconductor substrate, or a composite substrate thereof which is used for the fabrication of integrated circuits. The term "semiconductor integrated circuit device" as used herein means not only those devices fabricated over a semiconductor or insulator substrate, such as a silicon wafer or sapphire substrate, but also those devices formed over other insulating substrates, such as glass substrates, e.g., TFT (Thin Film Transistor) and STN (Super-Twisted-Nematic) liquid crystals, unless otherwise specifically indicated.

The term "device surface" means a main surface of a wafer over which device patterns corresponding to plural chip regions are to be formed by lithography.

The term "probe card" means a structural body having a contact terminal to be brought into contact with a wafer to be tested and a multilayer wiring substrate, while the term "semiconductor testing apparatus" means a testing apparatus having a probe card and a sample holder on which a wafer to be tested is placed.

The above-mentioned contact terminal is formed in a thin film sheet by a patterning technique which is combined with the wafer process in which a silicon wafer is used for the manufacture of a semiconductor integrated circuit, i.e., photolithography technology, CVD (Chemical Vapor Deposition) technology, sputtering technology, etching technology, etc.

The term "probe testing" means electrical testing, by using a probe card to contact a wafer whose wafer forming step has been completed, more specifically, electrical testing of a semiconductor integrated circuit by pressing the tip portion of the contact terminal against an electrode formed over the main surface of a chip region. In the probe testing, the circuit is judged as defective or non-defective based on the results of a function test for finding whether the product functions to specification or not, or it is based the results of tests on the DC operating characteristics and the AC operating characteristics. The probe testing is discriminated from a final test, such as a selection test, etc. to be performed after the wafer is divided into chips (or after completion of the packaging). By carrying out dicing after probe testing, the wafer is separated into chips and sorting of an excellent article is performed by a burn in examination and various tests of the operation being performed for every chip.

In the following description of the embodiments, the subject matter of the present invention may be divided in plural sections or in plural embodiments if necessary for convenience's sake. These plural sections or embodiments are not independent of each other, but are in a relation such that one is a modification, example, represents details or is a complementary description of a part or whole of the other one unless otherwise specifically indicated.

In the following description of the embodiments, when reference is made to a number of elements (including the number, value, amount and range), the number is not limited to a specific number, but can be greater than or less than the specific number unless otherwise specifically indicated, or it is principally apparent that the number is limited to the specific number.

Moreover, in the following description of the embodiments, it is needless to say that the constituting elements (including element steps) are not always essential unless otherwise specifically indicated, or it is principally apparent that they are essential.

Similarly, in the following description of the embodiments, when reference is made to the shape or positional relationship of the constituting elements, that substantially analogous or similar to it is also embraced, unless otherwise specifically indicated, or it is principally apparent that it is not. This also applies to the above-described value and range.

In all of the drawings, members having a like function will be identified by the same reference numerals and overlapping descriptions thereof will be omitted.

In the drawings, even a plan view is sometimes partially hatched for facilitating an understanding of it.

Hereafter, various embodiments of the present invention will be explained in detail with reference to the drawings.

Embodiment 1

Figure 2:
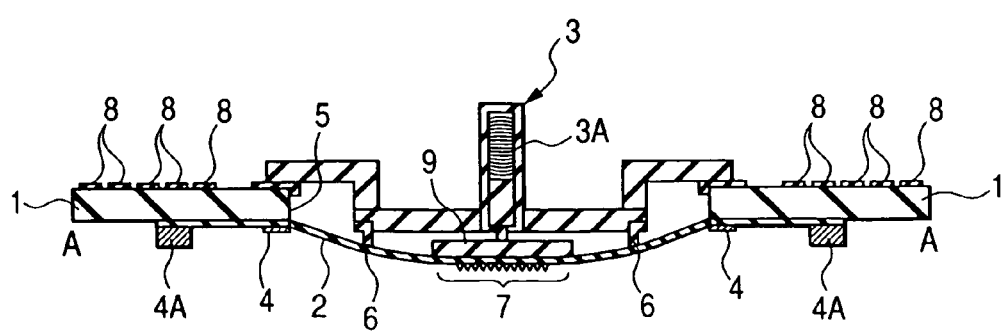
FIG. 2 is a sectional view taken along the line A-A in FIG. 1.
Figure 3:
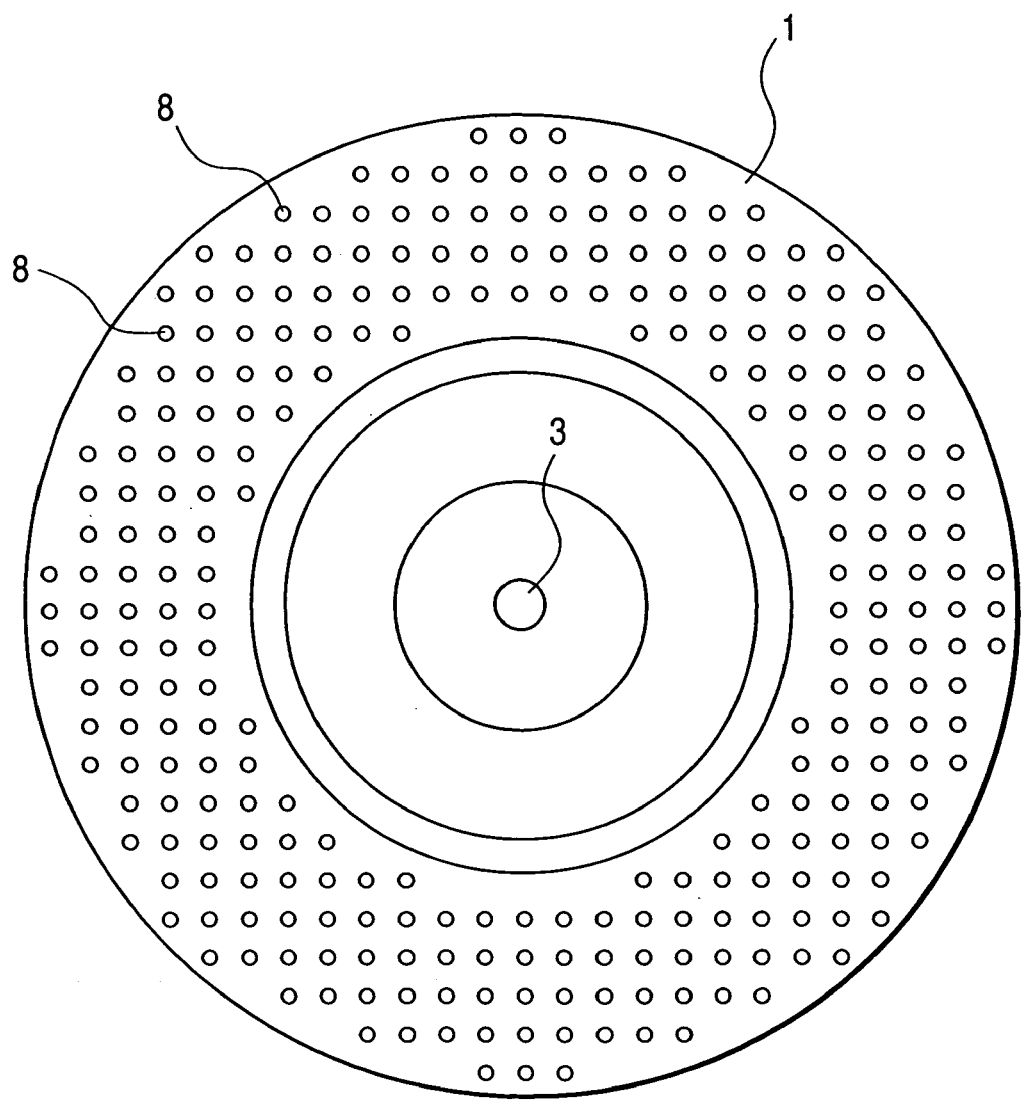
FIG. 3 is a plan view of the upper surface of the mentioned probe card of Embodiment 1.

FIG. 1 is a plan view of the undersurface of the probe card of Embodiment 1, and FIG. 2 is a sectional view taken along the line A-A in FIG. 1. FIG. 3 is a plan view of the upper surface of the above-mentioned probe card.

As shown in FIGS. 1 and 2, the probe card (the first card) of Embodiment 1 is formed, for example, from a multilayer wiring substrate (also simply called a "wiring substrate") 1, a thin film sheet (thin film probe (the first sheet)) 2, a plunger (pressing mechanism) 3, etc. The thin film sheet 2 is fixed to the undersurface of the multilayer wiring substrate 1 by means of a hold-down ring (the first ring) 4, and the plunger 3 is attached to the upper surface of the multilayer wiring substrate 1. An opening portion 5 is formed in the central part of the multilayer wiring substrate 1, and the thin film sheet 2 and the plunger 3 are pasted up via the adhesion ring (the second ring) 6 in this opening portion 5. The border of the thin film sheet 2 is fixed to the multilayer wiring substrate 1 using the perimeter ring 4A, which has a larger diameter than the above-mentioned hold-down ring 4.

Figure 4:
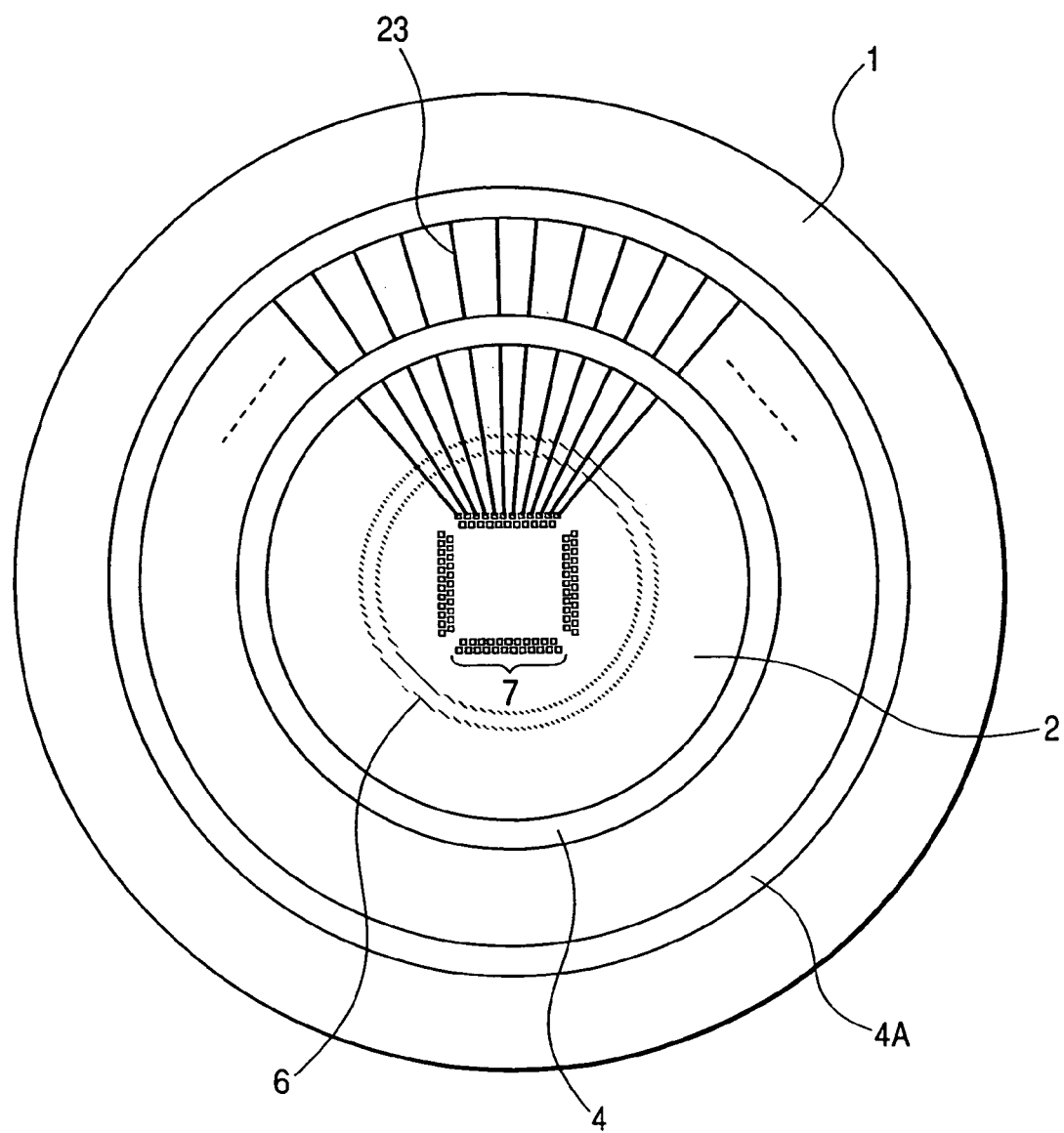
FIG. 4 is a plan view of the undersurface of the probe card showing the wiring in the mentioned probe card of Embodiment 1.

Two or more four-pyramid type or four-truncated-pyramid type probes (contact terminal) 7 are formed in the undersurface of the thin film sheet 2, for example. In the thin film sheet 2, two or more wirings (the second wirings), are formed, which connect to each probe 7 electrically and which extend from each probe 7 to the end of the thin film sheet 2. These two or more wirings are formed so as to radiate toward the border of the thin film sheet 2 from the probe 7 formation domain of the central part of the thin film sheet 2, as 4 shown at 23 in FIG. 4.

Two or more pressure welding lands are formed in the undersurface of the multilayer wiring substrate 1. Two or more of these pressure welding lands are formed corresponding to the ends of two or more wirings in the multilayer wiring substrate 1, and they are electrically connected to the ends of the wirings when the thin film sheet 2 is attached in the multilayer wiring substrate 1, as shown at 543 in FIG. 55 and FIG. 57, for example. Two or more pressure welding lands 543 are electrically connected to two or more pogo-seats 8 provided in the upper surface of the multilayer wiring substrate 1 through the wirings (the first wirings) formed in the multilayer wiring substrate 1. Many pogo-seats 8 are formed on the upper surface of the multilayer wiring substrate 1, as shown in FIG. 3. As shown, for example, in FIG. 55 or FIG. 57, the pogo-seat 8 has the function of receiving the pogo-seat contact 549 for enabling an exchange of various signals with a tester (not shown) when electrical testing of a semiconductor integrated circuit is conducted. The pogo-seat contact 549 enables electrical connection at a tip thereof with the pogo-seat 8 by pressing it against the force of a spring which biases the contact pin in an axial direction. In Embodiment 1, the thin film sheet 2 is formed from a thin film in which polyimide is one of the main ingredients, for example. Since such a thin film sheet 2 has pliability, in order to bring all of the probes 7 into contact with the pad of a chip (a semiconductor integrated circuit device), the probe 7 has a structure in which a plunger 3 presses the thin film sheet 2 via a pressing tool (pressing mechanism) 9 from the upper surface (back surface), in Embodiment 1. That is, fixed pressure is applied to a pressing tool 9 according to the elastic power of the spring 3A arranged in the plunger 3. In Embodiment 1, 42 Alloy can be given as an example of the material of the pressing tool 9.

Here, in order to ensure contact by all probes with the pads of a chip, a probe card having a structure in which a plunger presses a probe is also disclosed in Japanese Unexamined Patent Publication No. 2001-159643, for example.

Figure 12:
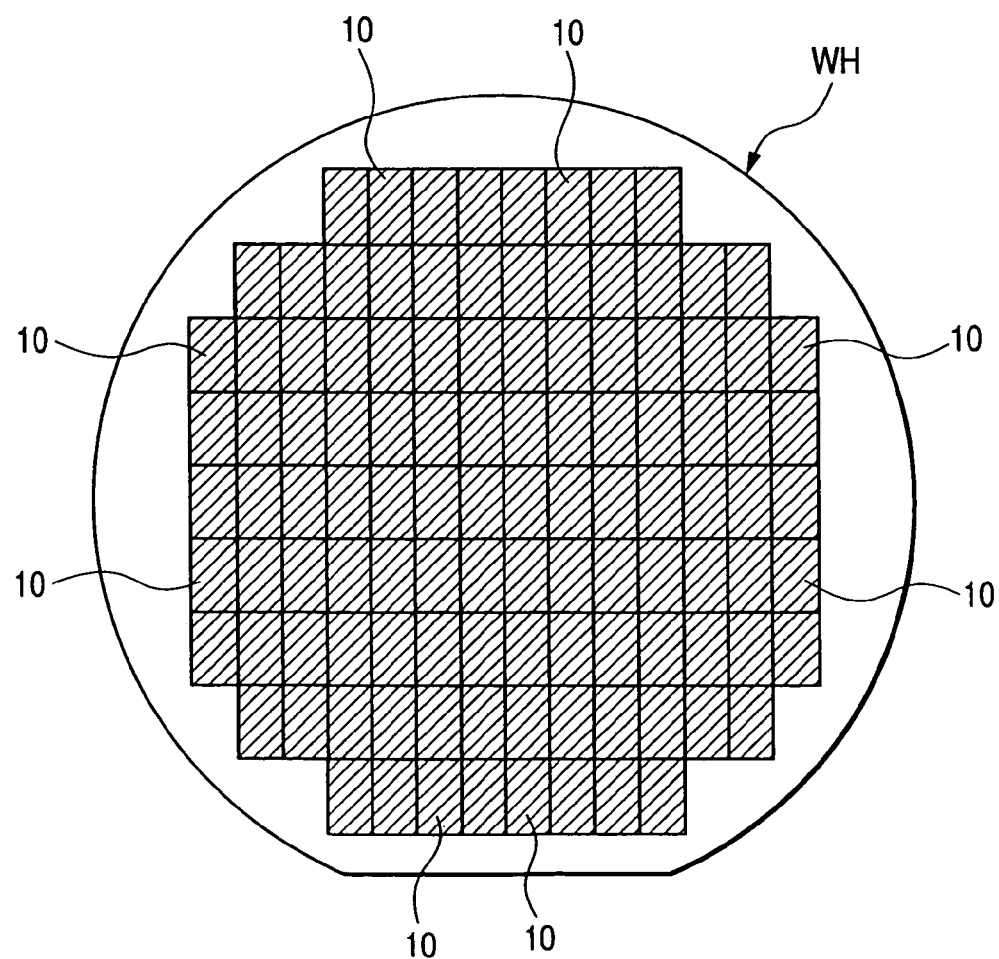
FIG. 12 is a plan view of a semiconductor wafer with which the semiconductor chip domain of the object, to which a probe testing is conducted using the probe card of Embodiment 1 of the invention, was formed.
Figure 13:
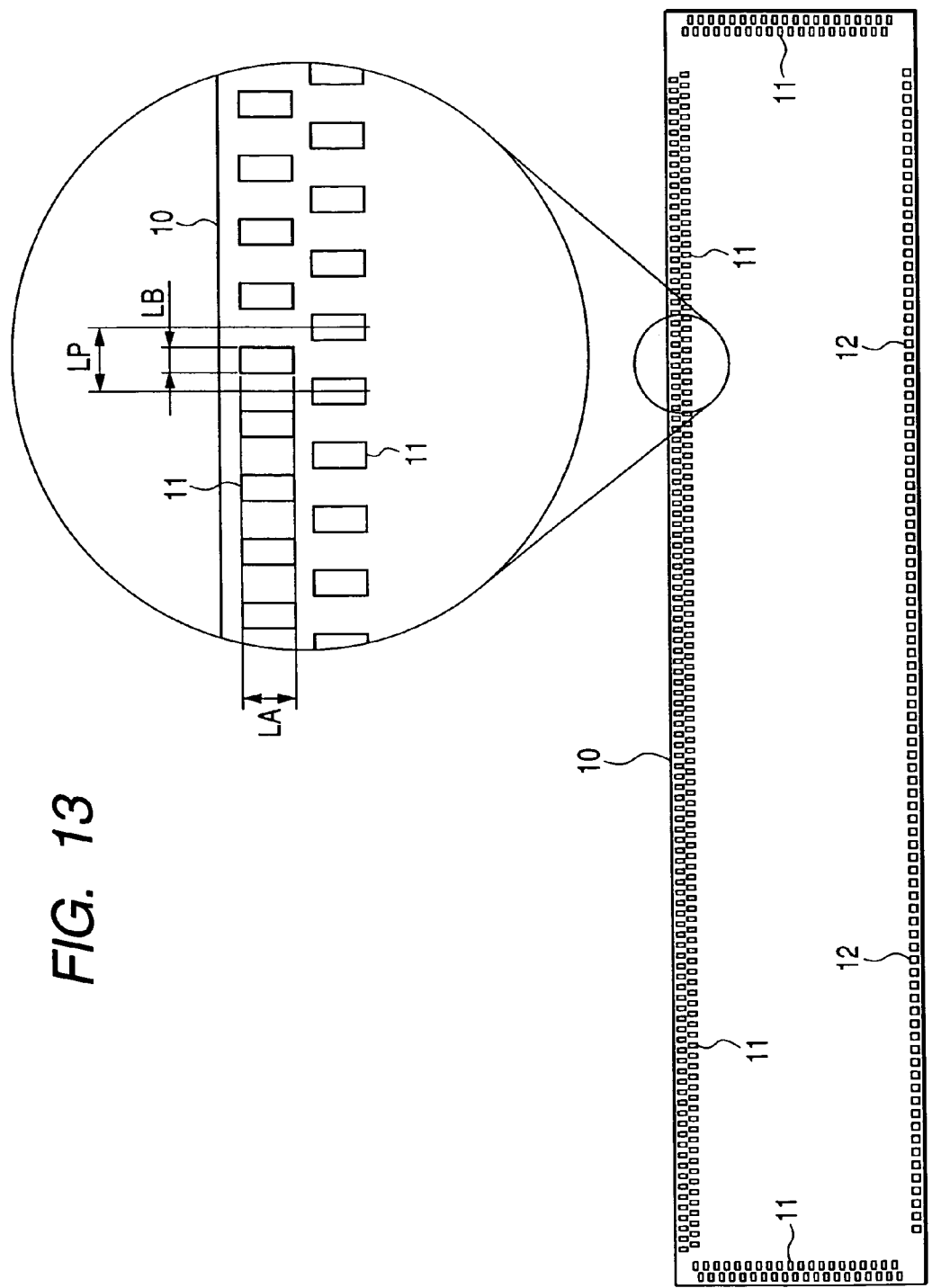
FIG. 13 is a plan view of the semiconductor chip of the object to which a probe testing is conducted using the probe card of Embodiment 1 of the invention.

In Embodiment 1, a chip having an LCD (Liquid Crystal Display) driver formed thereover, for example, is subjected to probe testing (electrical testing) using the probe card. FIG. 12 is a plan view of a wafer WH partitioned into a plurality of chips (chip regions) 10. The wafer WH partitioned into the chips 19 is subjected to probe testing using the probe card of Embodiment 1. FIG. 13 includes a plan view of the chip 10 and a partially enlarged view thereof. The chip 10 is made of, for example, a single crystal silicon substrate, and over the main surface of the chip, an LCD driver circuit is formed. At the periphery of the main surface of the chip 10, there are a large number of pads (the first electrodes) 11 and 12 which are electrically connected to the LCD driver circuit. In FIG. 13, the pads 11 arranged along the upper long side and both short sides of the chip 10 each serves as an output terminal, while pads 12 arranged along the lower long side of the chip 10 each serves as an input terminal. The number of the output terminals of the LCD driver is greater than that of the input terminals so that in order to widen the distance between two adjacent pads 11 as much as possible, the pads 11 are arranged in two rows along the upper long side and both short sides of the chip 10, and, besides, these two rows of the pads 11 on the upper long side and both short sides of the chip 10 are arranged in an offset manner. In Embodiment 1, the pitch LP between the two adjacent pads 11 is about 45 µm. In Embodiment 1, the pads 11 are each rectangular in plan view. The length LA of the long side extending in a direction crossing (at right angles) the outer circumference of the chip 10 is about 80 µm, while the length LB of the short side extending along the outer circumference of the chip 10 is about 30 µm.

Figure 14:
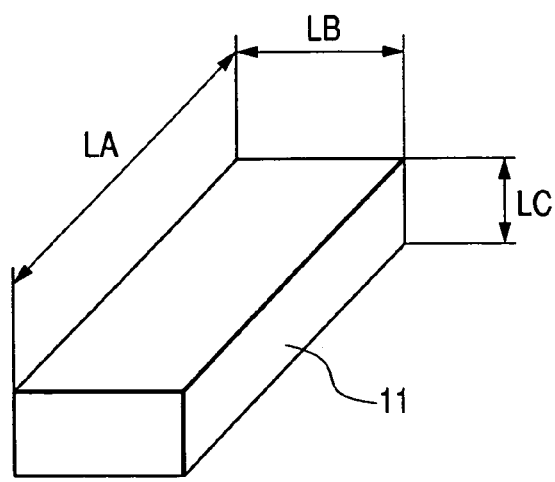
FIG. 14 is a perspective view of the pad formed in the semiconductor chip shown in FIG. 13.

The pads 11 and 12 are bump electrodes (projection electrodes) made of, for example, Au (gold) and they are formed over the input or output terminals (bonding pads) of the chip 10 by electroplating, electroless plating, deposition, sputtering or the like. FIG. 14 is a perspective view of the pad 11. The pad 11 has a height LC of about 15 µm and the pad 12 has a similar height.

The chip 10 can be manufactured by forming LCD driver circuits (semiconductor integrated circuits) or input/output terminals (bonding pads) in a large number of partitioned chip regions over the main surface of the wafer in accordance with conventional semiconductor fabrication technology, forming the pads 11 over the input/output terminals by the above-described method, and dicing the wafer into respective chip regions. In Embodiment 1, the probe testing is performed for each chip region prior to the dicing of the wafer. Upon description of the probe testing (a step by which the pads 11 and 12 are brought into contact with the probes 7) hereinafter, a reference to the chip 10 will mean each chip region before the dicing of the wafer unless otherwise specifically indicated.

Figure 15:
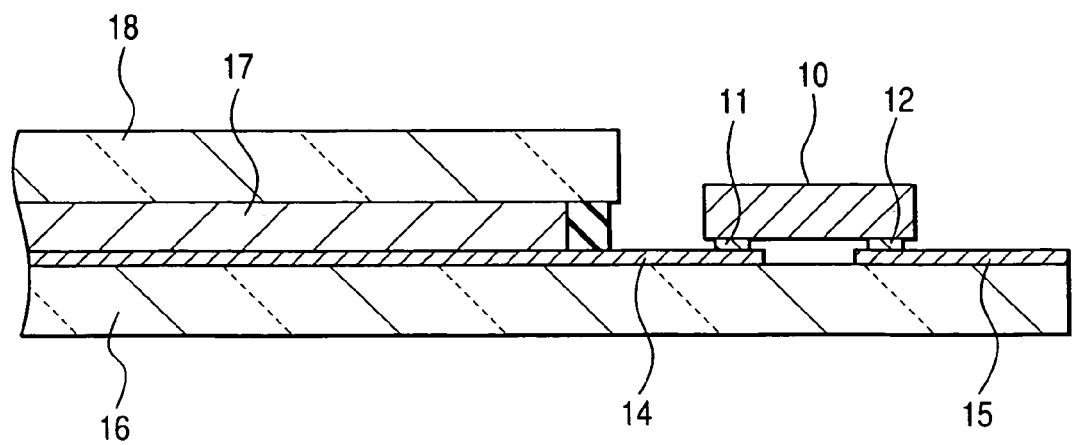
FIG. 15 is a sectional view showing the method of connection method to the liquid crystal panel of the semiconductor chip shown in FIG. 14.

FIG. 15 is a sectional view illustrating a method of connection of the chip 10 to a liquid crystal panel. As shown in FIG. 15, the liquid crystal panel has, for example, a glass substrate 16 having picture electrodes 14 and 15 formed over the main surface thereof, a liquid crystal layer 17, and a glass substrate 18 disposed opposite to the glass substrate 16 via the liquid crystal layer 17. In Embodiment 1, the chip 10 can be connected to the liquid crystal panel by facedown bonding of the chip 10 so that the pads 11 and 12 are connected to the picture electrodes 14 and 15 over the glass substrate 16 of the liquid crystal panel, respectively.

Figure 5:
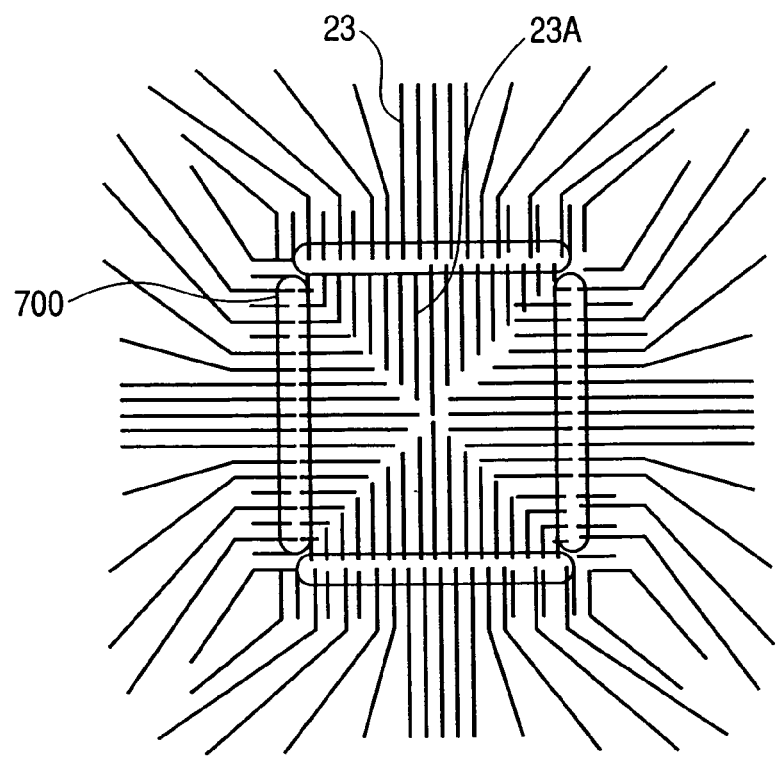
FIG. 5 is a wiring diagram of the central part of the thin film sheet in the mentioned probe card of Embodiment 1.
Figure 10:
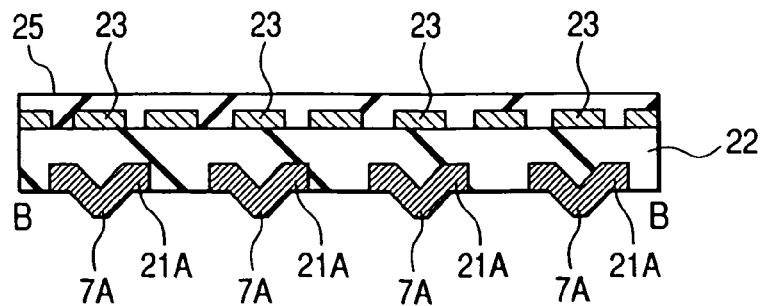
FIG. 10 is a sectional view taken along the line B-B in FIG. 9.
Figure 11:
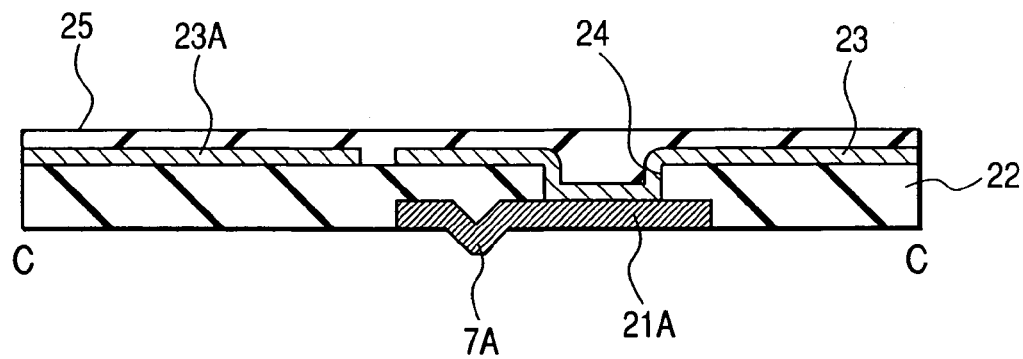
FIG. 11 is a sectional view taken along the line C-C in FIG. 9.

The central part (probe 7 neighborhood) of the above-mentioned thin film sheet 2 in FIG. 1 is enlarged in FIG. 5. The above-mentioned probe 7 in FIG. 1 is enlarged in FIG. 9. FIG. 10 is a sectional view taken along the line B-B in FIG. 9, and FIG. 11 is a sectional view taken along the line C-C in FIG. 9.

Figure 6:
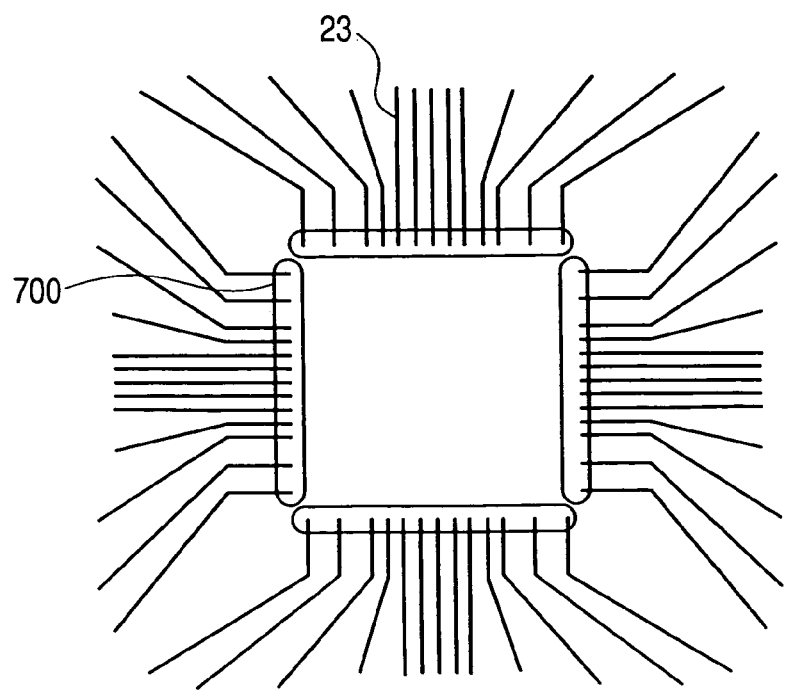
FIG. 6 is a wiring diagram which provides a comparison to the wiring shown in FIG. 5.

The probe formation domain 700 is formed in the central part in the above-mentioned thin film sheet 2, and two or more probes 7 are arranged in the shape of a rectangle here. Wirings 23 are formed in the shape of radiation toward the border part of the thin film sheet 2 from the probe formation domain 700. Also in the probe card of Embodiment 1, the dummy wirings 23A are formed independently of wirings 23, which are formed so as to radiate toward the border part of the thin film sheet 2 from the above-mentioned probe formation domain 700. The dummy wiring 23A is insulated in the wiring 23 and does not participate in signal transfer. FIG. 6 omits the dummy wirings 23A that are shown in FIG. 5. The dummy wirings 23A are formed in the place where the above-mentioned wirings 23 do not exist as seen clearly from a comparison of FIG. 5 and FIG. 6. As shown in FIG. 6, when the dummy wirings 23A do not exist, the rigidity of the thin film sheet 2 is small in the place in which wirings 23 are not formed, while the rigidity of the thin film sheet 2 is large in the place in which wirings 23 are formed. Therefore, the rigidity balance of the thin film sheet 2 will collapse on the inner side and outside of the probe formation domain 700. As a result, a fault may be produced at the time of contact between the probe 7 formed in the probe formation domain 700, and the pad of a chip. For example, when two or more sequence arrangement of the electrode is carried out along with the perimeter of the chip section of a wafer, corresponding to it, two or more sequence formation also of the probe 7 formed in the probe formation domain 700 is carried out to the probe formation domain 700 (refer to FIG. 4). However, as shown in FIG. 6, when the dummy wirings 23A do not exist, the rigidity balance of the thin film sheet 2 will collapse on the inner side and outside of the probe formation domain 700. And, there is a possibility that the contact state of the probe inside the probe formation domain 700 and the pad of a chip may become imperfect especially. On the other hand, since the rigidity of the thin film sheet 2 is equalized on the inner side and outside of the probe formation domain 700 when the dummy wirings 23A are formed in the place where the above-mentioned wirings 23 do not exist, as shown in FIG. 5, a good contact state of a probe 7 and the pad of a chip can be maintained.

Figure 9:
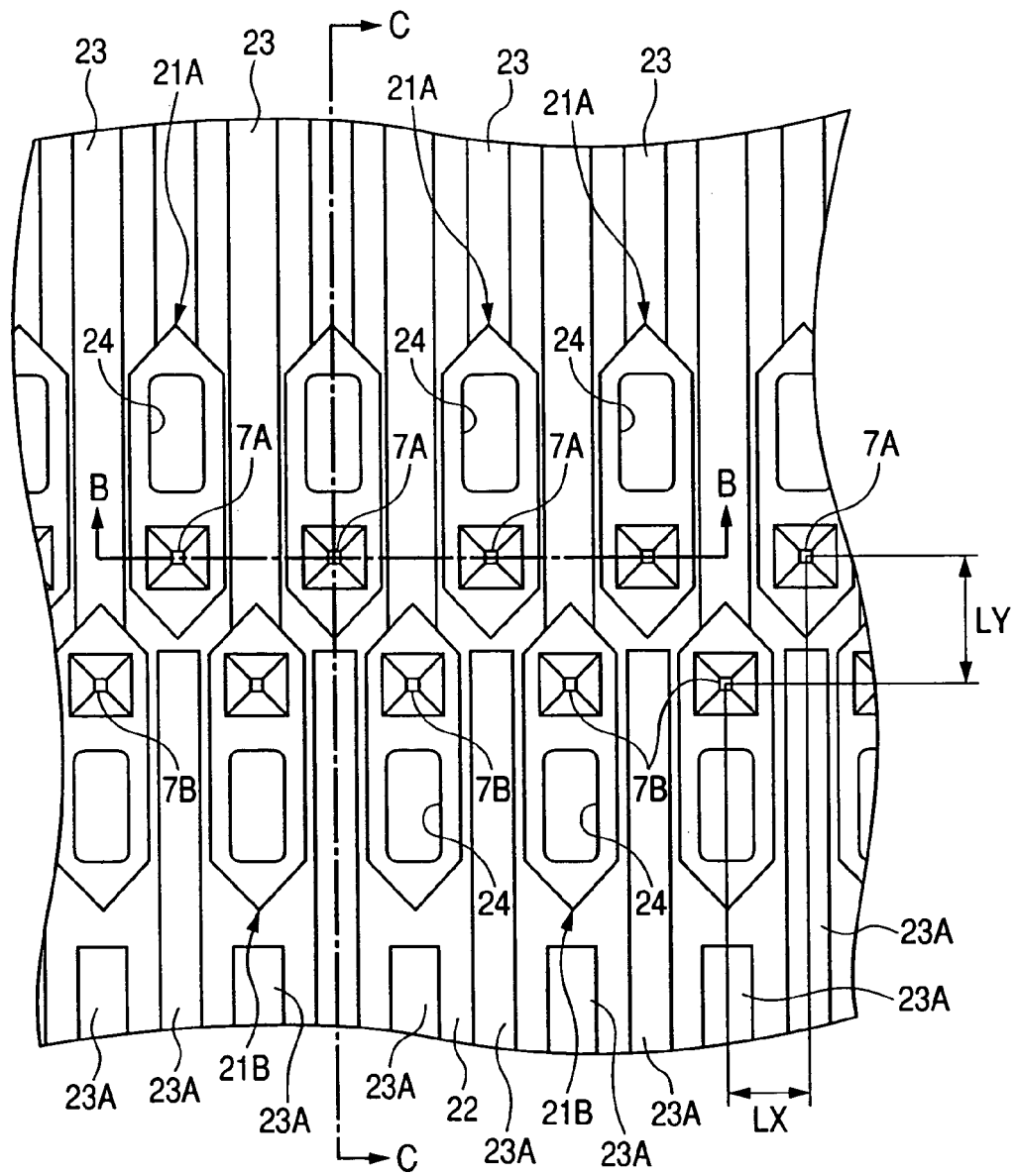
FIG. 9 is a plan view of the thin film sheet in the probe card of Embodiment 1.

Each of the probes 7, as shown in FIG. 9, consists of a portion of a metal film 21A or 21B which has been patterned into a hexagonal planar shape in the thin film sheet 2, and, on the metal film 21A or 21B, there is a portion which protrudes as a four sided pyramid or four sided truncated-pyramid type projection from the lower surface of the thin film sheet 2. The probes 7 are disposed over the main surface of the thin film sheet 2 according to the positions of the pads 11 and 12 formed over the chip 10. FIG. 9 illustrates the positions of the probes 7 corresponding to the pads 11. Of these probes 7, probes 7A correspond to the pads 11 of a row which is relatively near to the outer circumference of the chip 10 (this row will hereinafter be called "the first row") among the pads 11 arranged in two rows, while probes 7B correspond to the pads 11 of the other row which is relatively far from the outer circumference of the chip 10 (which will hereinafter be called "the second row") among the pads 11 arranged in two rows. The distance between the nearest two probe 7A and probe 7B is defined as distance LX in the horizontal direction and LY in the vertical direction, as seen in FIG. 9, and the distance LX is 22.5 μm, half of the pitch LP of the two adjacent pads 11. In Embodiment 1, the distance LY is about 100 μm.

The metal films 21A and 21B are each formed, for example, by stacking a rhodium film and a nickel film one on another in this order. A polyimide film 22 is formed over the metal films 21A and 21B, as seen in FIG. 11, and, over the polyimide film 22, an wiring (the second wiring) 23 connected to each metal film 21 is formed. The wiring 23 is in contact with the metal films 21A and 21B at the bottom of a through-hole 24 formed in the polyimide film 23. Over the polyimide film 22 and wiring 23, a polyimide film 25 is formed.

As described above, the metal films 21A and 21B are part of the probes 7A and 7B, respectively, that is formed in a four sided pyramid or four sided truncated-pyramid form, and in the polyimide film 22, the through-hole 24 reaching each of the metal films 21A and 21B is formed. If a plane pattern of the metal film 21A having the probe 7A formed therein and the through-hole 24, and a plane pattern of the metal film 21B having the probe 7B formed therein and the through-hole 24 are disposed in the same direction, there is a fear that, owing to the inevitable contact between the adjacent metal film 21A and metal film 21B, the input/output connection available from the probe 7A and that from 7B would not be independent of each other. In this Embodiment 1, as shown in FIG. 9, the plane pattern of the metal film 21B having the probe 7B formed therein and the through-hole 24 is obtained by turning, by 180 degrees, the plane pattern of the metal film 21A having the probe 7A formed therein and the through-hole 24. This makes it possible to avoid a planar arrangement, a disposition on a horizontal line in the drawing, of the width portion of the metal film 21A having the probe 7A and through-hole 24 arranged therein and the width portion of the metal 21B having the probe 7B and the through-hole 24 arranged therein. Instead, the forward tapered portions, as a planar shape, of the metal film 21A and the metal film 21B are arranged on a different horizontal line in the drawing. As a result, such inconveniences as inevitable contact between the adjacent metal film 21A and metal film 21B can be prevented.

Figure 7:
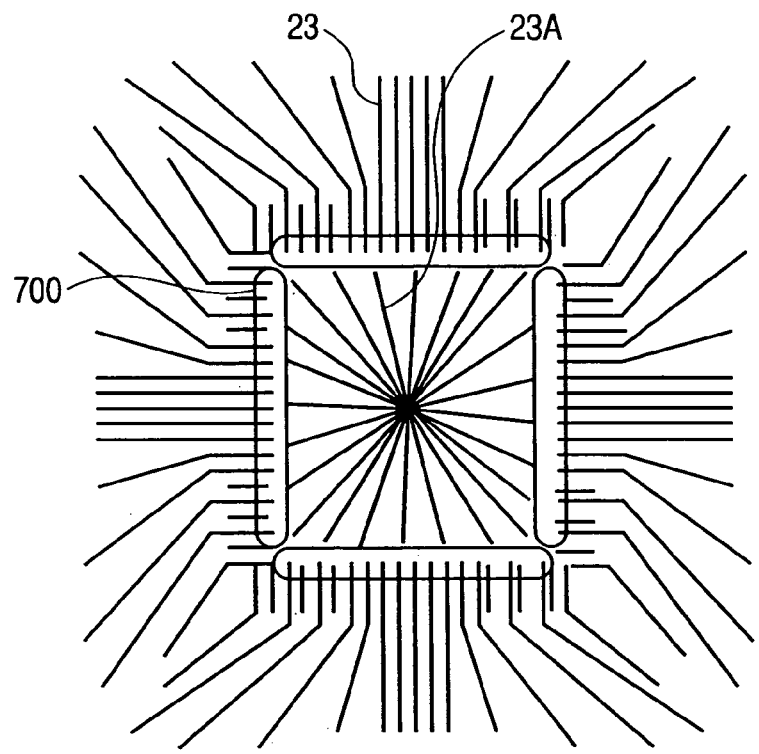
FIG. 7 is a wiring diagram of the central part of the thin film sheet in the probe card.
Figure 8:
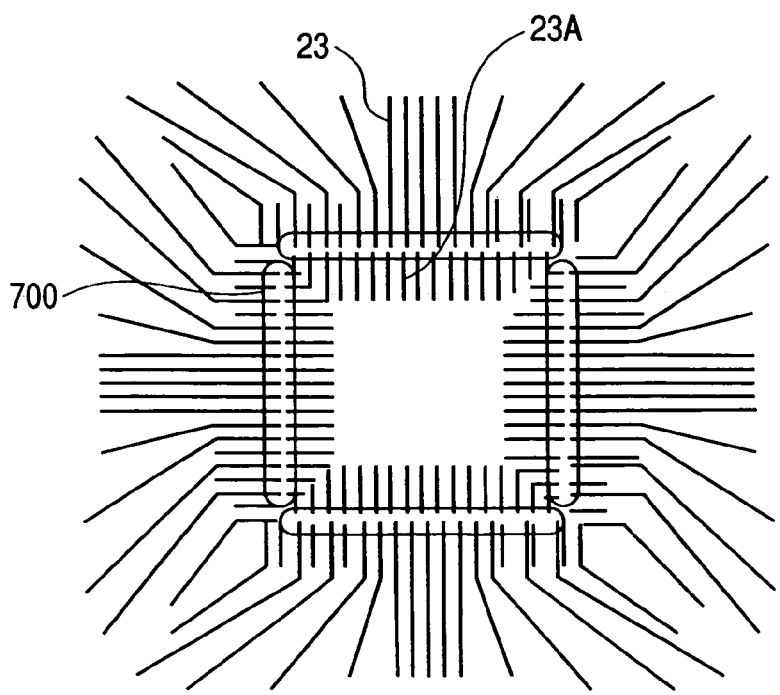
FIG. 8 is a wiring diagram of the central part of the thin film sheet in the probe card of Embodiment 1.

The above-mentioned dummy wiring 23A is formed using the same wiring layer as the wiring 23, as shown in FIG. 11. The above-mentioned dummy wirings 23A may be formed so as to radiate toward the probe formation domain 700 from the central part of the thin film sheet 2, as shown in FIG. 7. Moreover, as shown in FIG. 8, they may be formed only in the neighborhood of the probe formation domain 700, and, in the central part of the thin film sheet 2, formation of the above-mentioned dummy wirings 23A may be omitted.

Figure 16:
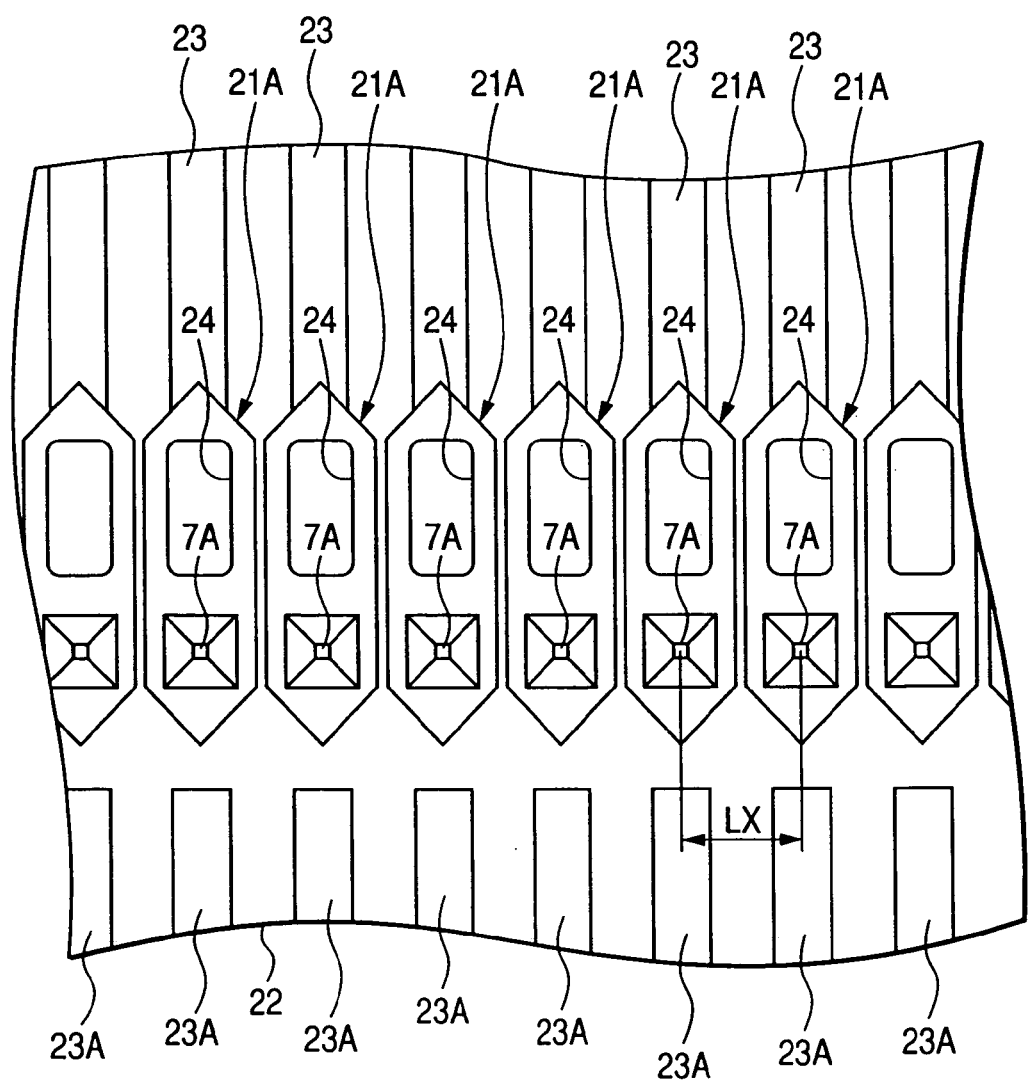
FIG. 16 is a plan view of the thin film sheet which forms the probe card of Embodiment 1 of the invention.
Figure 17:
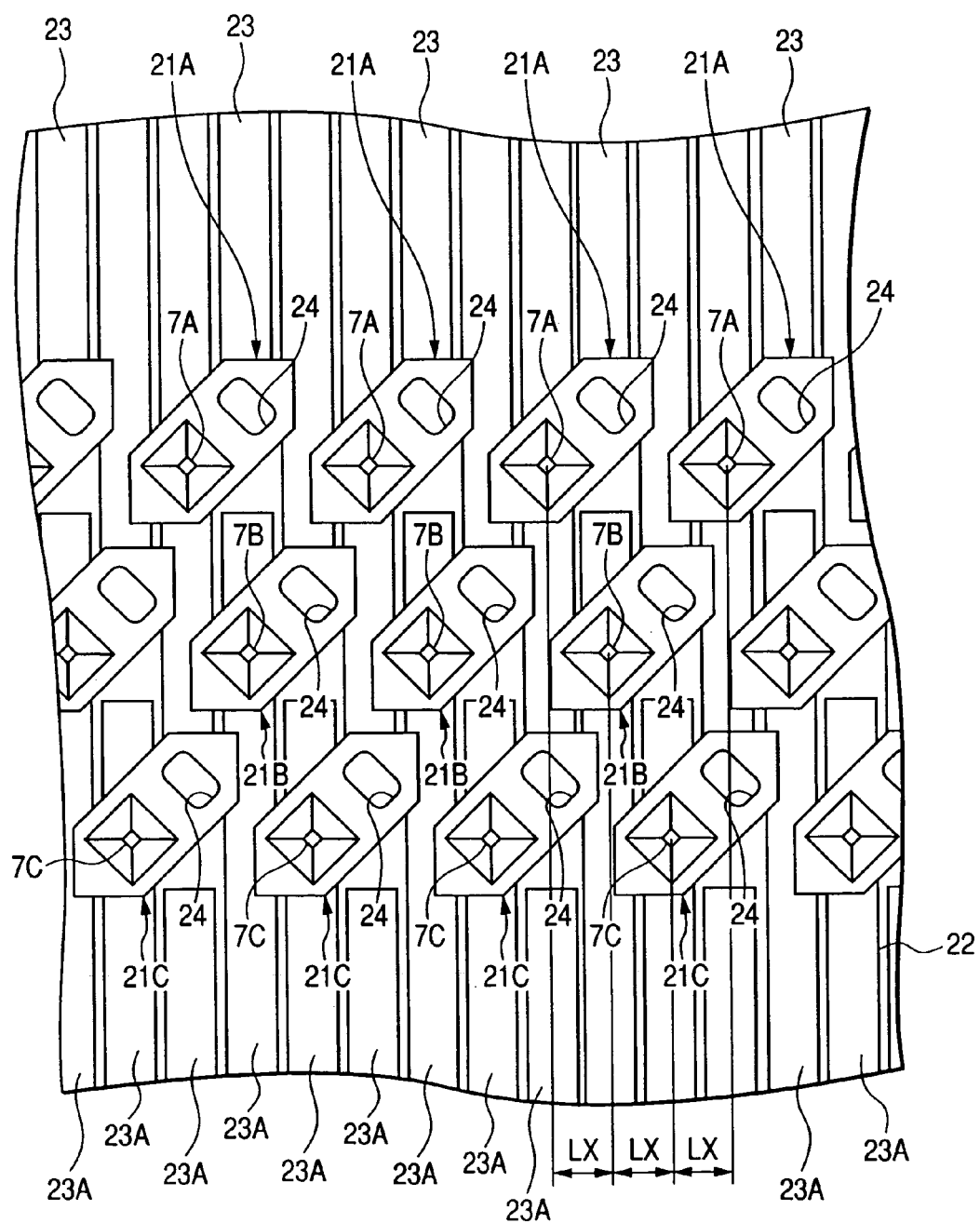
FIG. 17 is a plan view of the thin film sheet which forms the probe card of Embodiment 1 of the invention.
Figure 18:
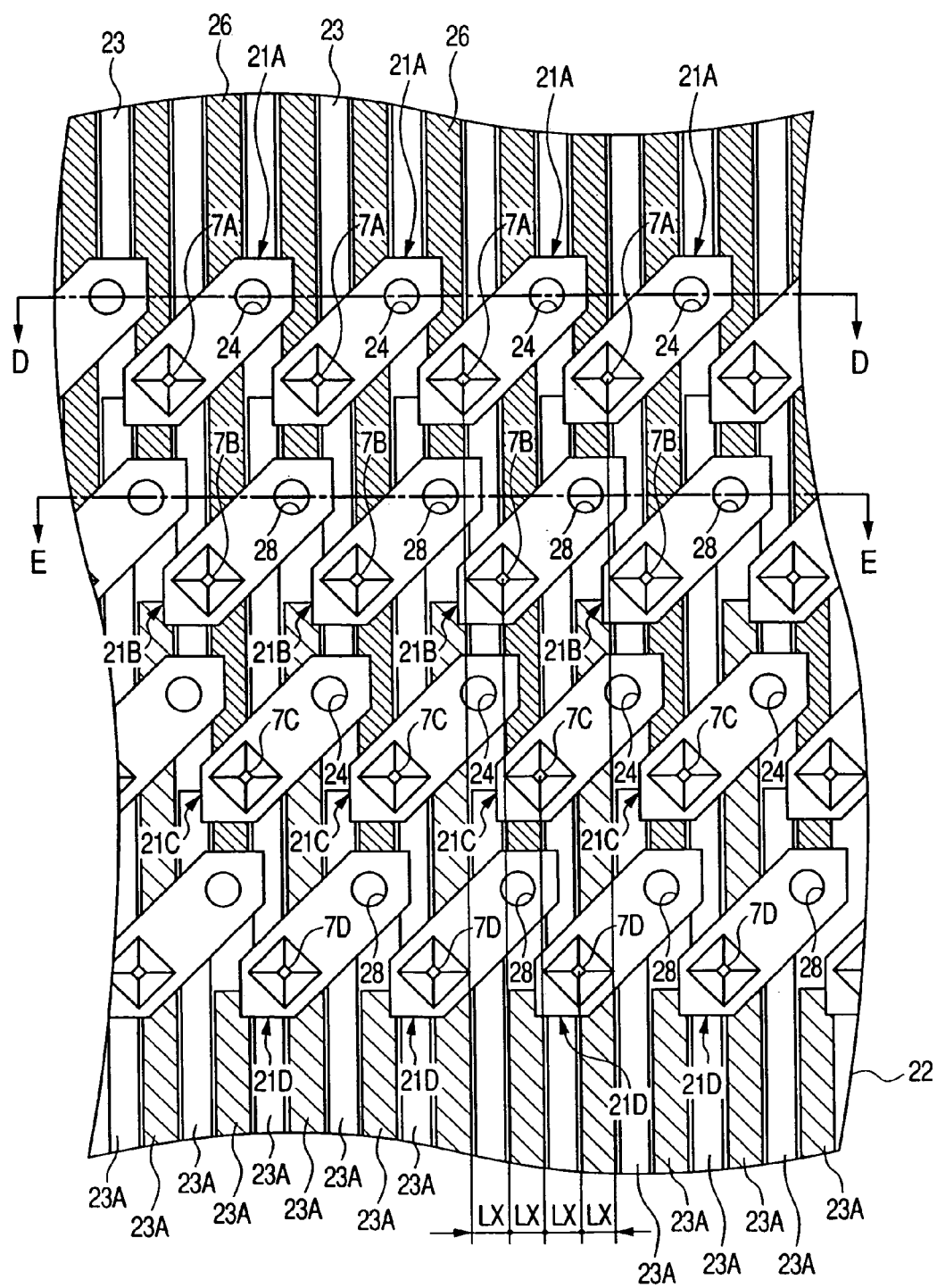
FIG. 18 is a plan view of the thin film sheet which forms the probe card of Embodiment 1 of the invention.

In the description of Embodiment 1, a chip having pads 11 arranged in two rows has been considered. When the chip has pads arranged in one row, on the other hand, a thin film sheet 2, as shown in FIG. 16, in which the width portions of the metal films 21A have been arranged on a horizontal line in the drawing can be used. When the chip has a greater number of the pads 11, they are sometimes arranged in at least 3 rows. FIG. 17 is a plan view of a thin film sheet 2 having the pads 11 arranged in three rows, while FIG. 18 is a plan view of a thin film sheet 2 having the pads 11 arranged in four rows. When the size of the chip is not changed, the distance LX as explained with reference to FIG. 9 becomes narrower with an increase in the number of pads 11, and so there is a fear that contact between the metal films, including the metal films 21A and 21B, may occur. As shown in FIGS. 17 and 18, by turning the metal films 21A, 21B, 21C and 21D, by 45 degrees, the plane pattern of the metal film 21A of FIG. 9, such inconveniences as mutual contact among the metal films 21A, 21B, 21C and 21D can be prevented. Here, the plane pattern of the metal film 21A shown in FIG. 9 is turned by 45 degrees. It is needless to say that the angle through which the plane pattern is to be turned is not limited to 45 degrees, but it may be another angle if mutual contact among the metal films 21A, 21B, 21C and 21D can be avoided. The metal film 21 C has a probe 7C corresponding to the pad 11 which is disposed at an inner position within the chip 10 relative to the pad 11 to which the probe 7B corresponds, while the metal film 21D has a probe 7D corresponding to the pad 11 which is disposed at an inner position within the chip 10 relative to the pad 11 to which the probe 7C corresponds.

Figure 19:
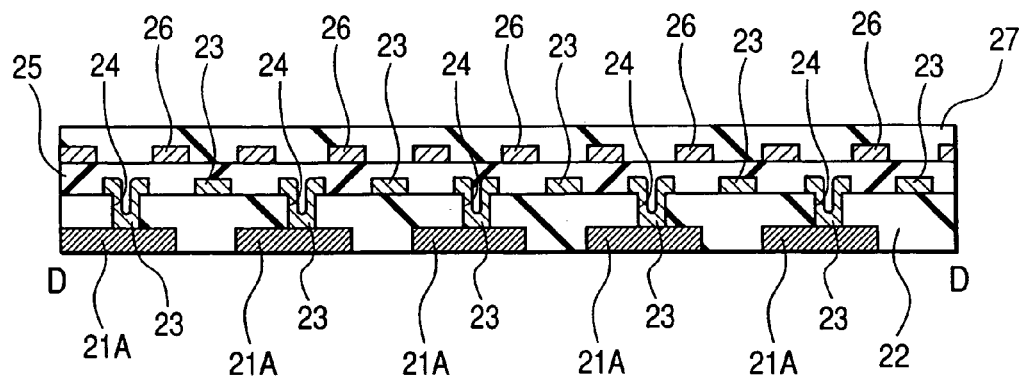
FIG. 19 is a sectional view taken along the line D-D in FIG. 18.
Figure 20:
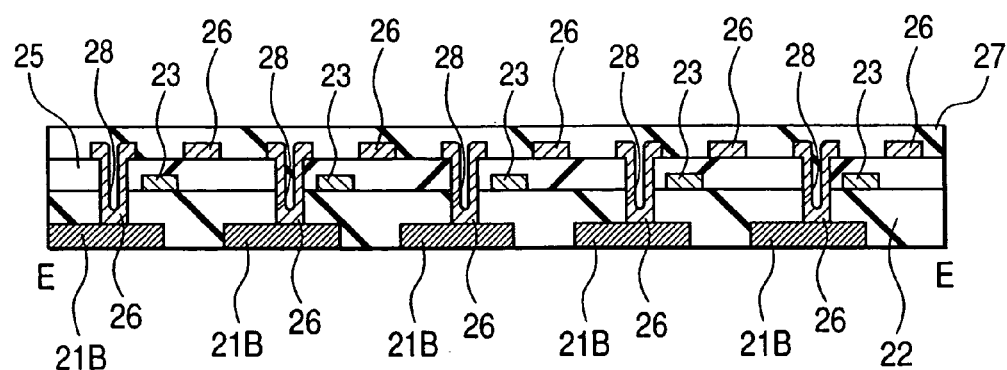
FIG. 20 is a sectional view taken along the line E-E in FIG. 18.

FIG. 19 is a sectional view taken along a line D-D of FIG. 18, and FIG. 20 is a sectional view taken along a line E-E of FIG. 18. When the metal films 21A to 21D having the probes 7A to 7D corresponding to the four rows of the pads 11 are arranged as shown in FIG. 19, it becomes difficult to form, as one wiring layer, all the overlying wirings that are electrically connected to the metal films 21A to 21D. This is because mutual contact between the metal films 21A to 21D may occur owing to the narrowing of the distance LX, and, in addition, mutual contact between the wirings electrically connected to the metal films 21A to 21D may occur. In Embodiment 1, these wirings are formed as two wiring layers (wirings 23 and 26), as shown in FIGS. 19 and 20. In this case, the dummy wirings 23A can be formed using a two-layer wiring layer like wirings 23 and 26.

A polyimide film 27 is formed over the wiring 26 and the polyimide film 25. The relatively lower wiring 23 is in contact with the metal films 21A and 21C on the bottom of the through-hole 24 formed in the polyimide film 22, while the relatively upper wiring 26 is in contact with the metal films 21B and 21D on the bottom of the through-hole 28 formed in the polyimide films 22 and 25. This makes it possible to keep a large distance between the two adjacent wirings 23 or the two adjacent wirings 26 in the same wiring layer and, thereby, prevent contact between the two adjacent wirings 23 and 26. When the pads 11 are arranged in at least five rows, the number of probes corresponding to them increases and the distance LX becomes narrow, the distance between wirings may be widened by increasing the number of wiring layers.

The structure of the thin film sheet 2 of Embodiment 1 and its manufacturing steps will be described next with reference to FIGS. 21 to 29. FIGS. 21 to 29 are each a sectional view of the thin film sheet 2, which has the probes 7A and 7B corresponding to two rows of the pads 11 (refer to FIG. 13), as described with reference to FIGS. 9 to 11, showing steps in its manufacture. Descriptions of the structure and manufacturing steps of a thin film sheet, and the structure and manufacturing steps of probes having a similar structure to those of the probes 7 (probes 7A to 7D) can also be found in Japanese Unexamined Patent Publications Nos. Hei 6 (1994)-22885, Hei 7 (1995)-283280, Hei 8 (1996)-50146, and Hei 8 (1996)-201427, Japanese Patent Application No. Hei 9 (1997)-119107, Japanese Unexamined Patent Publication Nos. Hei 11 (1999)-23615, 2002-139554 and Hei 10 (1998)-308423, Japanese Patent Application No. Hei 9 (1997)-189660, Japanese Unexamined Patent Publications No. Hei 11 (1999)-97471 and 2000-150594, and Japanese Patent Application No. 2002-289377, 2002-294376, 2003-189949 and 2003-74429.

Figure 21:
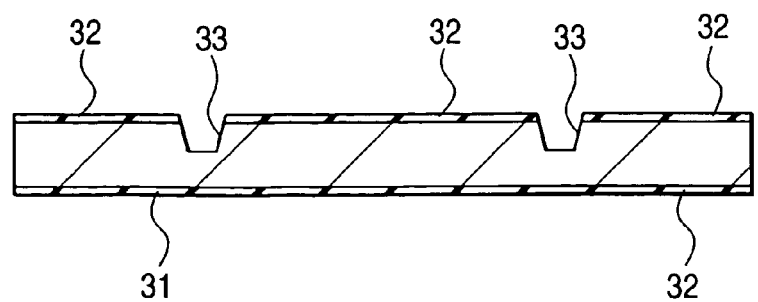
FIG. 21 is a sectional view showing a step in the manufacturing process of the thin film sheet which forms the probe card of Embodiment 1 of the invention.

As shown in FIG. 21, over both sides of a wafer (the first substrate) 31 made of silicon having a thickness of from about 0.2 to 0.6 mm, a silicon oxide film 32 is formed by thermal oxidation to a film thickness of about 0.5 μm. Using a photoresist film as a mask, the silicon oxide film 32 over the main surface side of the wafer 31 is etched to form, in the silicon oxide film 32 over the main surface side of the wafer 31, an opening portion reaching the wafer 31. Using the remaining portion of the silicon oxide film 32 as a mask, the wafer 31 is anisotropically etched with a strong aqueous alkaline solution (for example, an aqueous solution of potassium hydroxide) to form a hole (the first hole) 33 in the shape of a four sided pyramid or four sided truncated-pyramid encompassed by a (111) plane over the main surface of the wafer 31.

Figure 22:
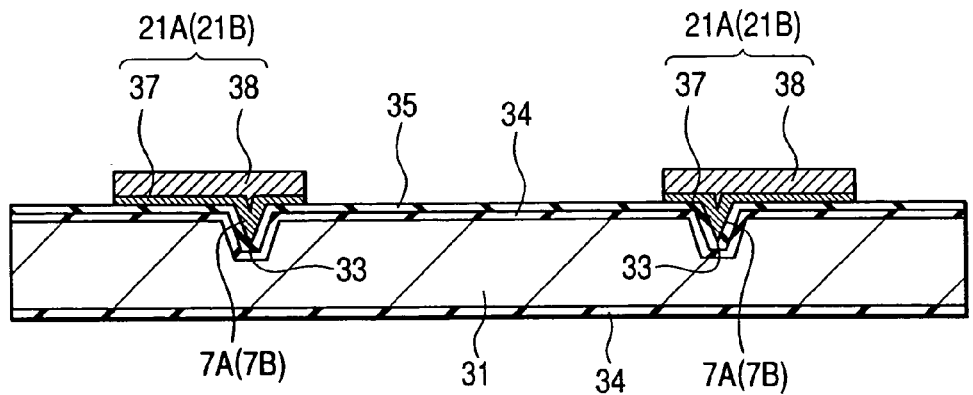
FIG. 22 is a sectional view in the manufacturing process of the thin film sheet following the step of FIG. 21.

As shown in FIG. 22, the silicon oxide film used as a mask upon formation of the hole 33 is removed by wet etching using a mixed solution of hydrofluoric acid and ammonium fluoride. The wafer 31 is then thermally oxidized to form a silicon oxide film 34 having a thickness of about 0.5 μm all over the surface of the wafer 31, including the inside of the hole 33. Over the main surface of the wafer 31, including the inside of the hole 33, a conductive film 35 is then formed. This conductive film 35 can be formed, for example, by successively depositing a chromium film which is about 0.1 μm thick and a copper film which is about 1 μm thick by sputtering or vapor deposition. After formation of a photoresist film over the conductive film 35, the photoresist film is removed by photolithography from a region in which metal films 21A and 21B (refer to FIGS. 9 to 11) will be formed in the subsequent step, whereby an opening portion is formed.

By electroplating using the conductive film 35 as an electrode, extremely hard conductive films 37, 38 are deposited successively over the conductive film 35 which has appeared on the bottom of the opening portion of the photoresist film. In Embodiment 1, for example, a rhodium film is used as the conductive film 37, while a nickel film is used as the conductive film 38. By the steps so far described, the metal film 21A or 21B can be formed from the conductive films 37 and 38. The conductive films 37 and 38 in the hole 33 become the probe 7A or 7B. The conductive film 35 will be removed in the next step.

With respect to the metal film 21A or 21B, the conductive film 37 made of a rhodium film will be a surface film when the probe 7A or 7B is formed in the later steps and the conductive film 37 will be brought into direct contact with the pad 11. For the conductive film 37, a material having a high hardness and excellent abrasion resistance is preferably selected. During testing, the conductive film 37 is brought into direct contact with the pad 11, so that when shavings of the pad 11 by the probe 7A or 7B attach to the conductive film 37, a cleaning step for removing the shavings becomes necessary, which may unfortunately prolong the probe testing step. As the material for the conductive film 37, a material that is resistant to adhesion of the material forming the pad 11 is preferably selected. In Embodiment 1, a rhodium film capable of satisfying these conditions is selected as the conductive film 37. This makes it possible to omit the cleaning step (, a cleaning process is not necessarily eliminated). Since the conductive film 37 has a higher strength and abrasion resistance with an increase in its thickness, formation of a thicker film is preferred to prolong the life of the probe 7A or 7B. The use of a rhodium film as the conductive film 37, however, has the disadvantage that a plating stress occurs during film formation, and this plating stress increases as the film becomes thicker. This plating stress acts on the interface between the silicon oxide film 34 and the conductive film 35, so that there is a concern that an increased plating stress may inconveniently cause peeling of the silicon oxide film 34 from the conductive film 35. Therefore, it is preferred, as one countermeasure against this problem, to make conductive film 37 as thick as possible within a range in which these will be no peeling of the silicon oxide film 34 from the conductive film 35. In Embodiment 1, for example, the thickness of this conductive film 37 is adjusted to fall within a range of from about 1 μm or greater to the maximum thickness (for example, about 4 μm) which can be formed actually by electroplating. The thickness is preferably from about 2 μm to 3.5 μm, more preferably about 2.5 μm. According to an experiment made by the present inventors with regard to abrasion resistance, the conductive film 37, having a thickness of about 2 μm, withstood contact about 1000,000 times between the probe 7A or 7B and the pads 12 in the probe testing. During the formation of the nickel film serving as the conductive film 38, a plating stress also occurs, though the stress is not greater than that of the conductive film 37. Therefore, it is preferred to adjust the thickness of the conductive film 38 to fall within a range in which there will be no peeling of the silicon oxide film 34 from the conductive film 35.

Figure 23:
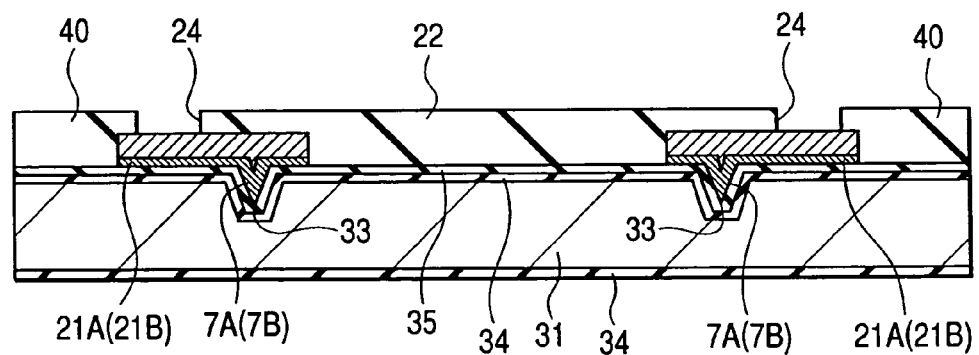
FIG. 23 is a sectional view in the manufacturing process of the thin film sheet following the step of FIG. 22.

After removal of the photoresist film employed for the formation of the metal film 21A or 21B (conductive films 37 and 38), a polyimide film (the first polyimide film) 22 (refer also to FIGS. 10 and 11) is formed to cover the metal film 21A or 21B, and the conductive film 35, as shown in FIG. 23. The through-hole (the first opening portion) 24 reaching the metal film 21A or 21B is formed in the polyimide film 22. It can be formed by laser beam drilling or dry etching using an aluminum film as a mask.

Figure 24:
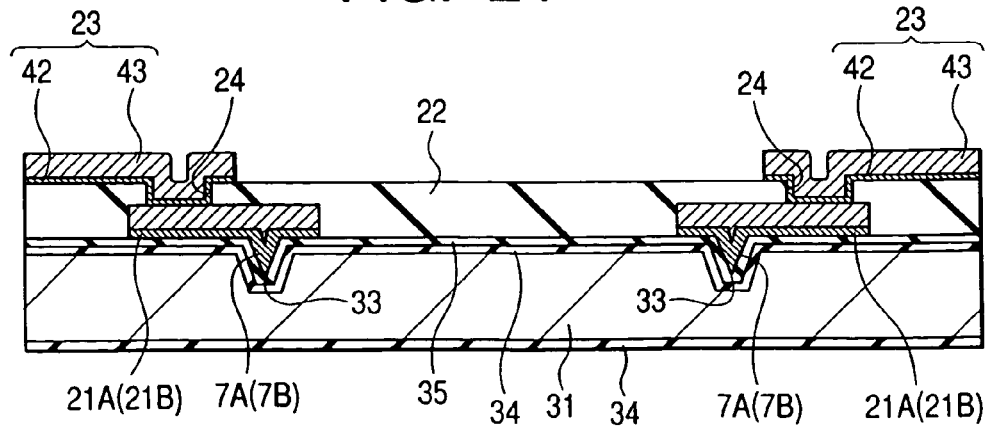
FIG. 24 is a sectional view in the manufacturing process of the thin film sheet following the step of FIG. 23.

As shown in FIG. 24, a conductive film (the second metal film) 42 is formed over the polyimide film 22, including the inside of the through-hole 24. This conductive film 42 can be formed, for example, by depositing a chromium film which is about 0.1 μm thick and a copper film which is about 1 μm thick successively by a sputtering method or an evaporating method. After formation of a photoresist film over the conductive film 42, the photoresist film is patterned by photolithography to form, in the photoresist film, an opening portion reaching the conductive film 42. By plating, a conductive film (the second metal film) 43 is then formed over the conductive film 42 in the opening portion. In Embodiment 1, a film obtained by stacking a copper film as the conductive film 43 and then a copper or nickel film in this order can be given as one example.

After removal of the photoresist film, the conductive film 42 is etched using the conductive film 43 as a mask, whereby a wiring 23 made of the conductive films 42 and 43 is formed. The wiring 23 can be electrically connected to the metal film 21A or 21B on the bottom of the through-hole 24.

The above-mentioned dummy wirings 23A are also formed as well as the above-mentioned wirings 23.

Figure 25:
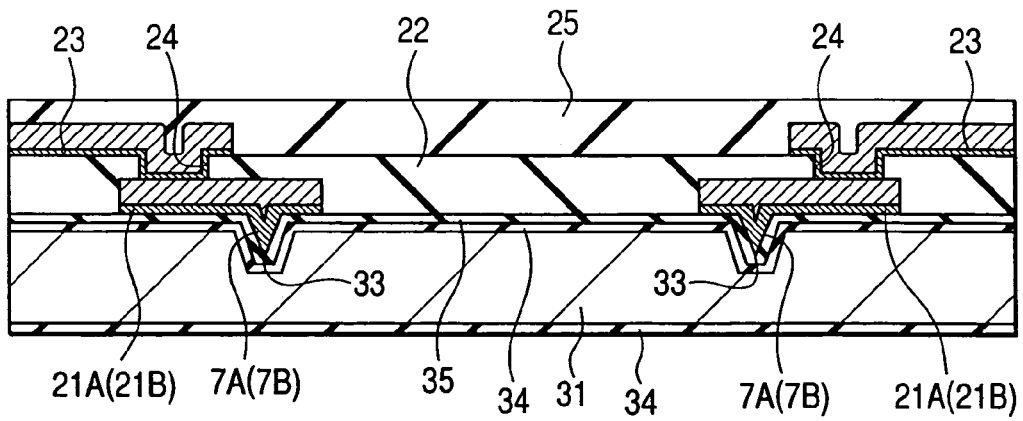
FIG. 25 is a sectional view in the manufacturing process of the thin film sheet following the step of FIG. 24.

As shown in FIG. 25, the polyimide film (the second polyimide film) 25, as described before, is formed over the main surface of the wafer 31. The polyimide film 25 functions as an adhesive layer of a metal sheet to be fixed onto the main surface of the wafer 31 in the subsequent step.

Figure 26:
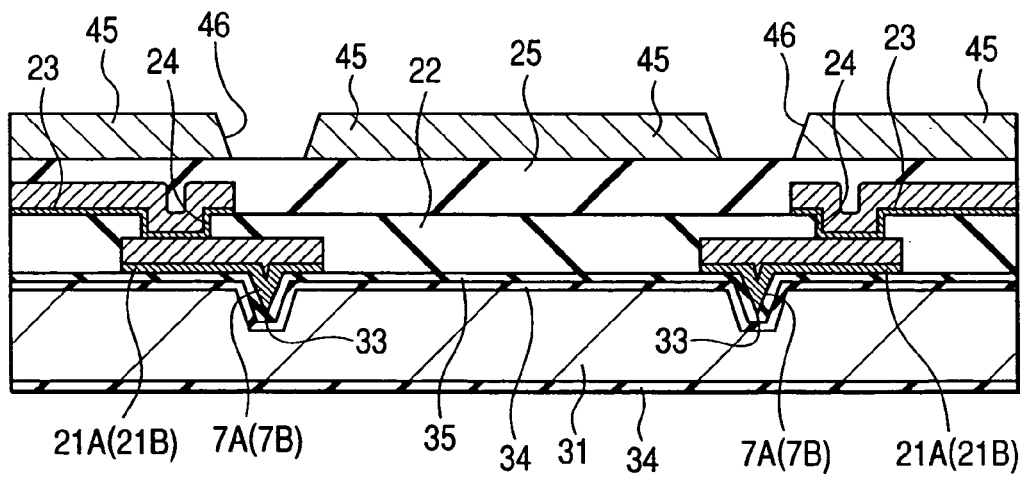
FIG. 26 is a sectional view in the manufacturing process of the thin film sheet following the step of FIG. 25.

As shown in FIG. 26, a metal sheet (the second sheet) 45 is then fixed to the upper surface of the polyimide film 25. As a material for the metal sheet 45, a material having a low linear expansion coefficient and, moreover, having a linear expansion coefficient close to that of the wafer 31, which is made of silicon, is selected. In Embodiment 1, 42 Alloy (an alloy containing 42% nickel and 58% iron and having a linear expansion coefficient of 4 ppm/° C.) or invar (an alloy containing 36% nickel and 64% iron and having a linear expansion coefficient of 1.5 ppm/° C.) can be given as an example. Instead of using the metal sheet 45, a silicon film similar to the wafer 31 in material quality may be formed, or a material having a linear expansion coefficient comparable to that of silicon, for example, an alloy of iron, nickel and cobalt, or a mixed material of ceramic and a resin, may be used. Such a metal sheet 45 can be fixed by laying it over the main surface of the wafer 31 so as to avoid misalignment of them and then heating the combination at a temperature at least equal to the glass transition point of the polyimide film 25 under pressure of from 10 to 200 kgf/cm$^2$ to perform bonding under pressure and heat.

The thin film sheet 2 having improved strength can be obtained by fixing the metal sheet 45 thereto using the polyimide film 25. When the metal sheet 45 is not fixed, a misalignment of the position of the probe 7A or 7B and the position of the pad 11 may occur owing to the expansion or shrinkage of the thin film sheet 2 and the wafer to be tested, as influenced by the temperature during probe testing. This may lead to an inconvenience such as contact failure between the probe 7A or 7B and the corresponding pad 11. According to Embodiment 1, on the other hand, the amount of expansion or shrinkage amount of the thin film sheet 2 and the wafer to be tested, which will otherwise vary depending on the temperature during probe testing, can be made uniform by fixing the metal sheet 45 to the wafer. This makes it possible to prevent the misalignment of the probe 7A or 7B with the corresponding pad 11. In other words, it becomes possible for the probe 7A or 7B to keep electrical contact with the corresponding pad 11 irrespective of the temperature during probe testing. In addition, it becomes possible to maintain relative positional accuracy between the thin film sheet 2 and the wafer to be tested under various conditions.

Next, a metal sheet 45 is etched by using as a mask the photoresist film patterned by photolithography technology. And, an opening portion (the second opening portion) 46 is formed in a metal sheet 45 on the probe 7A and 7B. In Embodiment 1, this etching can be considered as spray etching in which a ferric chloride solution is used.

Figure 27:
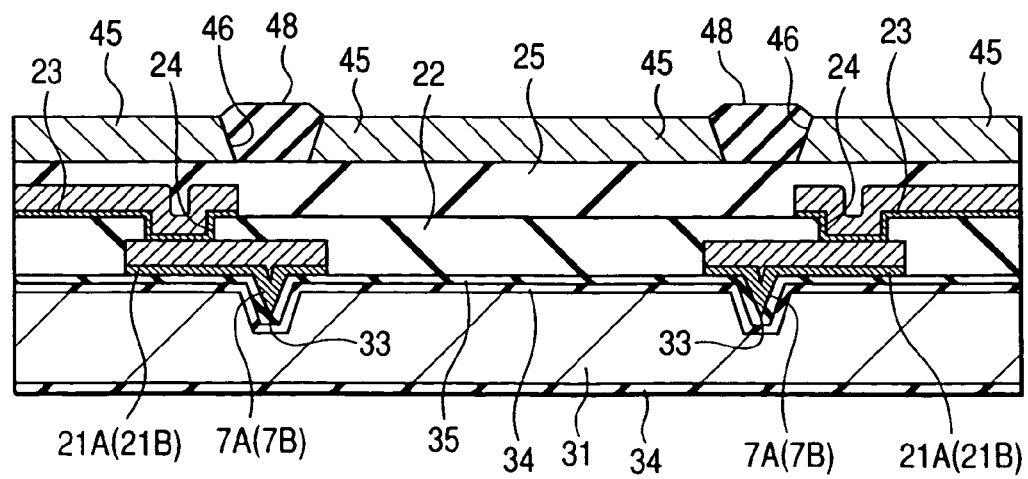
FIG. 27 is a sectional view in the manufacturing process of the thin film sheet following the step of FIG. 26.

After removal of the photoresist film, an elastomer (elastic material) 48 is formed in the opening portion 46, as shown in FIG. 27. The elastomer 48 is formed in such a manner that a predetermined amount of it protrudes from the opening portion 46. In Embodiment 1, the elastomer 48 is formed, for example, by applying an elastic resin to the inside of the opening portion 46 by printing or dispenser coating, or by disposing a silicon sheet. The elastomer 48 absorbs the difference in the height of the tip portions of a number of the probes 7A or 7B by partial deformation while relaxing the impact caused by the contact of the tip portions of the probes 7A or 7B with the pads 11. Thus, the elastomer 48 absorbs the difference in the height of the pad 11 by its elasticity and establishes contact between each probe 7A or 7B and the pad 11.

Figure 28:
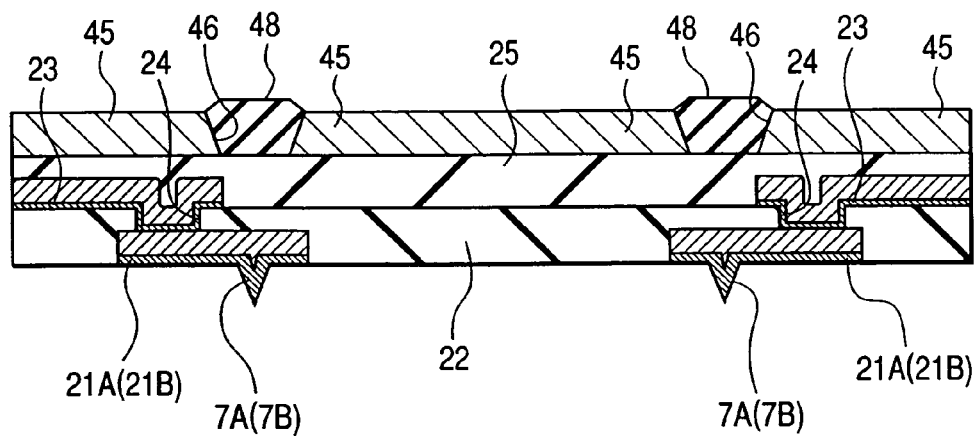
FIG. 28 is a sectional view in the manufacturing process of the thin film sheet following the step of FIG. 27.

As shown in FIG. 28, the silicon oxide film 34 on the reverse side of the wafer 31 is removed by etching, for example, using a mixed solution of hydrofluoric acid and ammonium fluoride. The wafer 31, which is in a shape for the formation of the thin film sheet 2, is then removed by etching with a strong aqueous alkali solution (for example, an aqueous solution of potassium hydroxide). The silicon oxide film 34 and conductive film 35 are removed successively by etching. The silicon oxide film 34 is etched using a mixture of hydrofluoric acid and ammonium fluoride, the chromium film constituting the conductive film 35 is etched using an aqueous solution of potassium permanganate, and the copper film constituting the conductive film 35 is etched with an alkaline copper etchant. By the steps so far mentioned, the rhodium film, which is the conductive film 37 (refer to FIG. 22) constituting the probe 7A or 7B, is exposed from the surface of the polyimide film 22. As described above, the probe 7A or 7B having a rhodium film as the surface film thereof is resistant to adhesion of a material such as the Au of the pad 11 with which the probe 7A or 7B is brought into contact, has higher hardness than Ni, and is not oxidized easily, so that a stable contact resistance can be attained.

Figure 29:
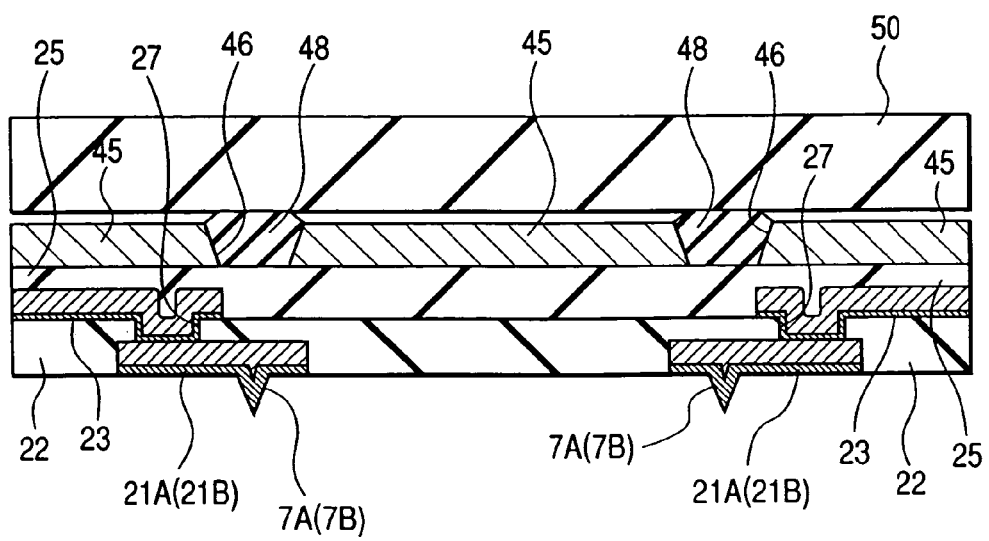
FIG. 29 is a sectional view in the manufacturing process of the thin film sheet following the step of FIG. 28.

Next, as shown in FIG. 29, the pressing tool 50 made of 42 Alloy is pasted up on the elastomer 48, and the thin film sheet 2 of Embodiment 1 is manufactured.

When the metal sheet 45 has been pasted up, the rigidity of the thin film sheet 2 of Embodiment 1 manufactured according to the above-mentioned process is improved.

Embodiment 2

Next, an Embodiment 2 of the present invention will be explained.

Figure 30:
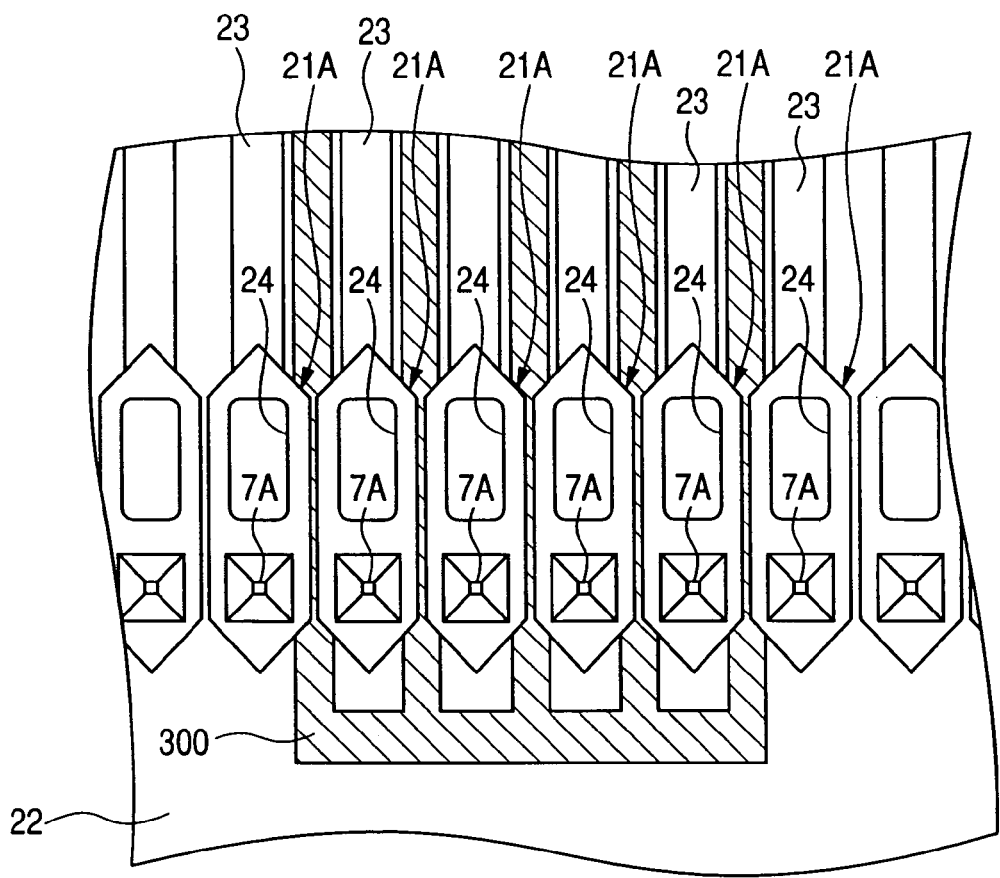
FIG. 30 is a plan view of the thin film sheet in the probe card of an Embodiment 2 of the invention.

There is some signal wiring which dislikes noise. When this factor is neglected, the influence of noise is received from a contiguity wiring or a power supply line, and it becomes impossible to inspect the function of the original semiconductor integrated circuit correctly in probe testing (electric testing). Thus, in the probe card of Embodiment 2, as shown, for example, in FIG. 30, in two or more wirings 23, the metal line 300 serving as a shield is formed so that signal wiring which is especially influenced by noise may be formed. The metal line 300 which is used for a shield can the same wiring layer as the above-mentioned wirings 23. The end of two or more of these metal lines 300 for a shield is suitably connected to a ground line (0V line of power supply voltage) in a part 4, for example, a hold-down ring, or the perimeter ring 4A while short-circuiting it so that the end of a wiring 23 may be surrounded. Since the signal wiring is protected by two or more metal lines 300 serving as a shield, the influence of noise is reduced. Thereby, in probe testing (electric testing), the function of the original semiconductor integrated circuit can be inspected correctly.

Figure 31:
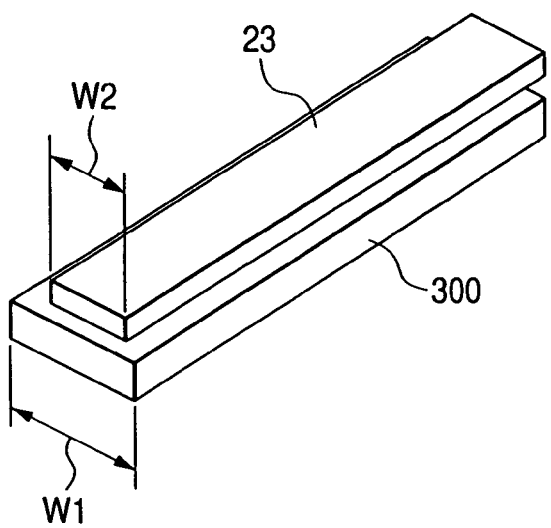
FIG. 31 is a perspective view of the shield structure of the thin film sheet in the probe card of Embodiment 2 of the invention.

As shown in FIG. 31, the metal line 300 to be used for a shield can be formed using the wiring layer just under the signal wiring 23 which is influenced by especially noise. In order to fully demonstrate the shield function, it is good to form the width W1 of the metal line 300 more widely than the width W2 of the signal wiring 23. What is necessary is to form the metal line 300 using the wiring layer right above the signal wiring 23, and just to put the signal wiring 23 with the up-and-down metal line 300, although this is not illustrated.

Embodiment 3

Next, an Embodiment 3 of the present invention will be explained.

Figure 32:
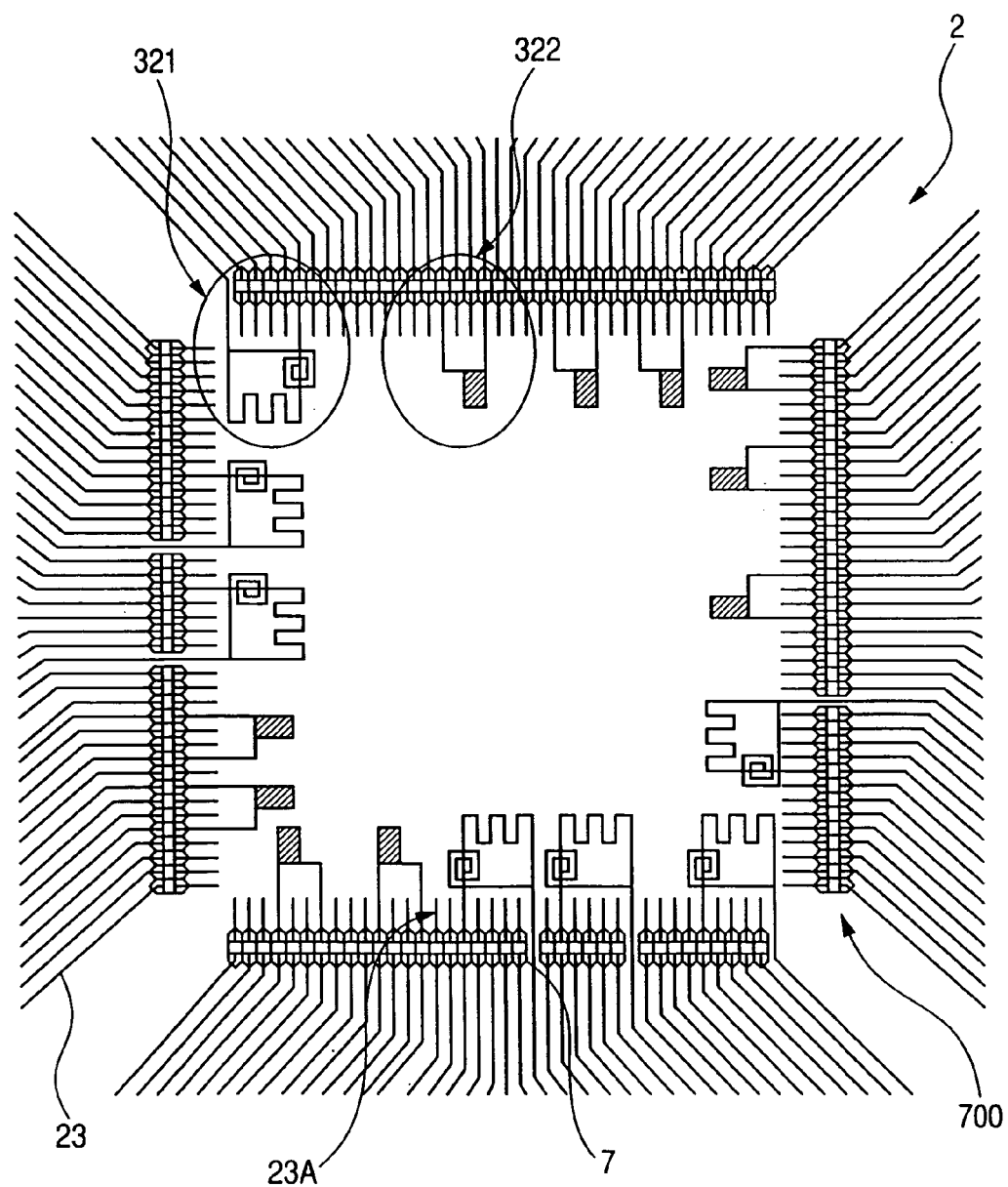
FIG. 32 is a plan view of the thin film sheet in the probe card of an Embodiment 3 of the invention.

A thin film can be patterned by exposure to form a resistor, a capacitor and an inductor. Then, in the probe card of Embodiment 3, as shown, for example, in FIG. 32, the impedance matching circuit 321 and a capacitor 322 can be formed using the inner side of the above-mentioned probe formation domain 700 in the thin film sheet 2.

Figure 33:
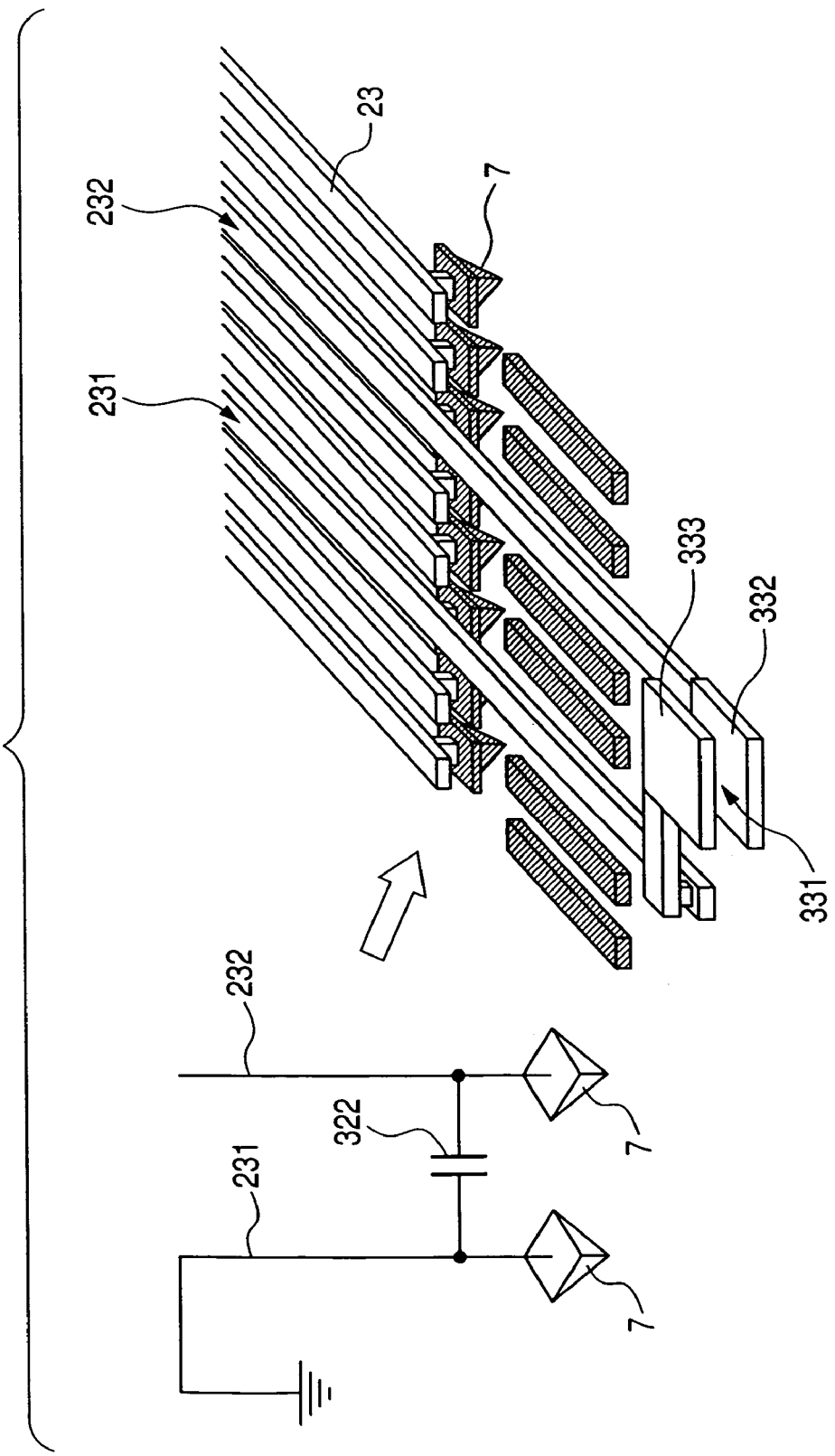
FIG. 33 is a diagram of the main circuits formed in the thin film sheet in the probe card of Embodiment 3 of the invention.

The above-mentioned capacitor 322 is formed between the ground lines (GND line) 231 and the power supply lines (Vdd line) 232, which are contained in two or more wiring 23, as shown in FIG. 33. And, the noise contained in the ground line 231 or the power supply line 232 can be reduced by the above-mentioned capacitor 322. The above-mentioned capacitor 331 is made from opposite arrangement of the electrodes 332,333 that are formed using a mutually different wiring layer. The electrical connection of the electrode 332 is carried out to the power supply line 232, and the electrical connection of the electrode 333 is carried out to the ground line 231. The insulated film between electrodes 332,333 is formed with polyimide etc. If the interlayer film thickness=L, the specific inductive capacity of polyimide is 3.4, and the dielectric constant $\epsilon=8.84\times10^{-12}$, the electric capacity C of a capacitor 322 can create a capacity of 3.0 fF as 10 μm of film thickness of 10 μm angle, from $C=\epsilon \cdot (S/L)$.

Figure 34:
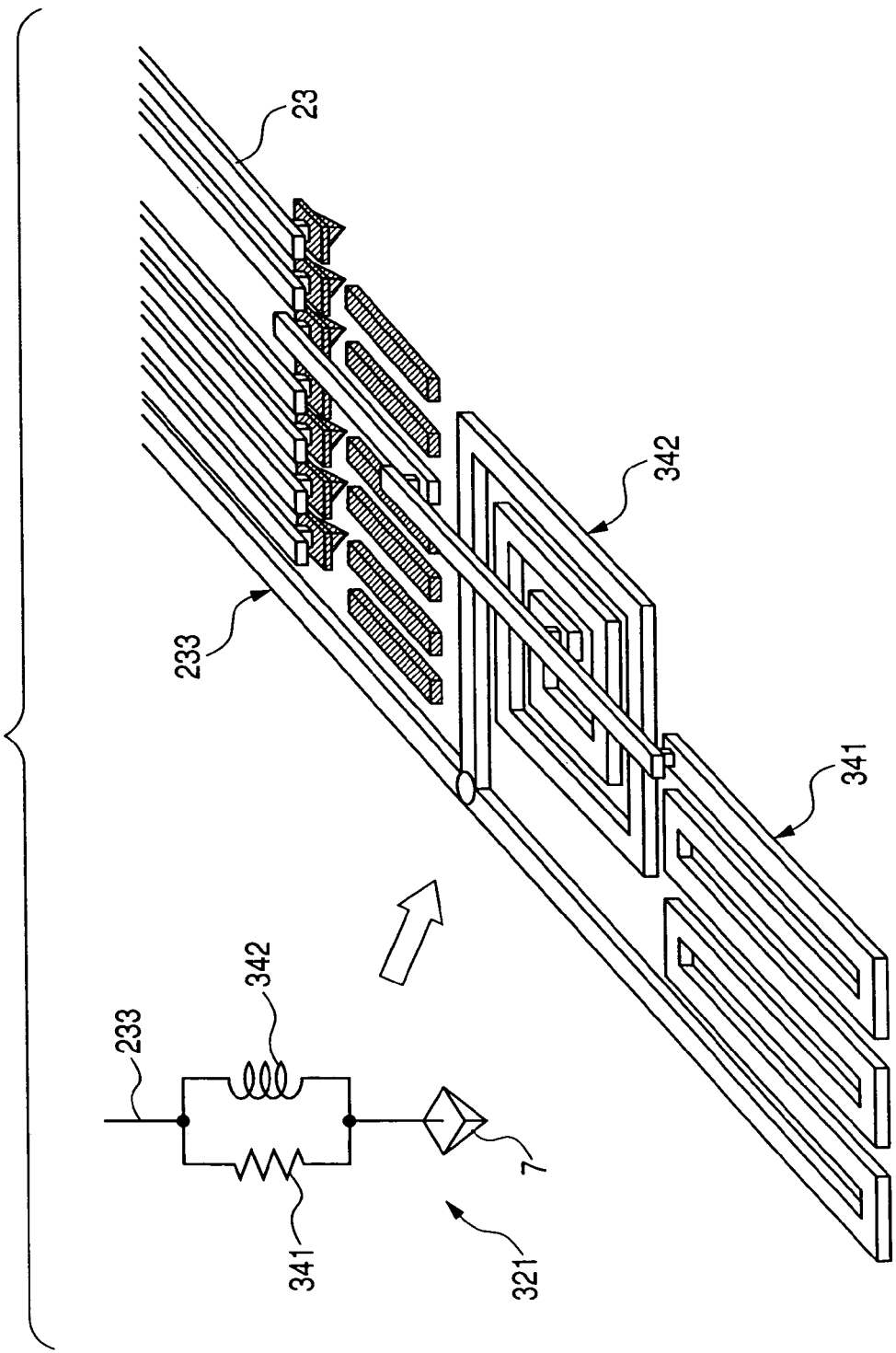
FIG. 34 is a diagram of the main circuits formed in the thin film sheet in the probe card of Embodiment 3 of the invention.

The above-mentioned impedance matching circuit 321 is inserted in order to suppress reflection of a signal in a signal transfer system, and the constant is determined by a relation with the source of a signal. As shown in FIG. 34, the above-mentioned impedance matching circuit 321 may be the multiple connection circuit of a resistance 341 and an inductor 342. This multiple connection circuit is arranged between the signal line 233 and a probe 7. The resistance 341 and an inductor 342 are formed using a wiring layer. The inductor 342 can obtain a self-inductance of about 350 nH(s) by a swirl pattern of 1 mm angle. The impedance of the impedance matching circuit 321 can be adjusted with the value of a resistance 341 and an inductor 342. The value of resistance 341 is proportional to the length of the signal wiring which forms a resistance. Since reflection of a signal is suppressed by the impedance of a signal transfer system being matched by forming the impedance matching circuit 321, in probe testing (electric testing), the function of the original semiconductor integrated circuit can be inspected correctly.

Embodiment 4

Next, an Embodiment 4 of the present invention will be explained.

In the step which prepares a probe card, it is necessary to attach, in a wiring substrate 1, the thin film sheet 2 corresponding to the wafer a subject of examination, using the right spatial relationship. However, it is not easy to check the spatial relationship of the detailed arrangement of a probe 7, which has been formed in the central part of the thin film sheet 2, and the wiring substrate 1 merely by observation, and to position the thin film sheet 2 to a wiring substrate 1.

Figure 35:
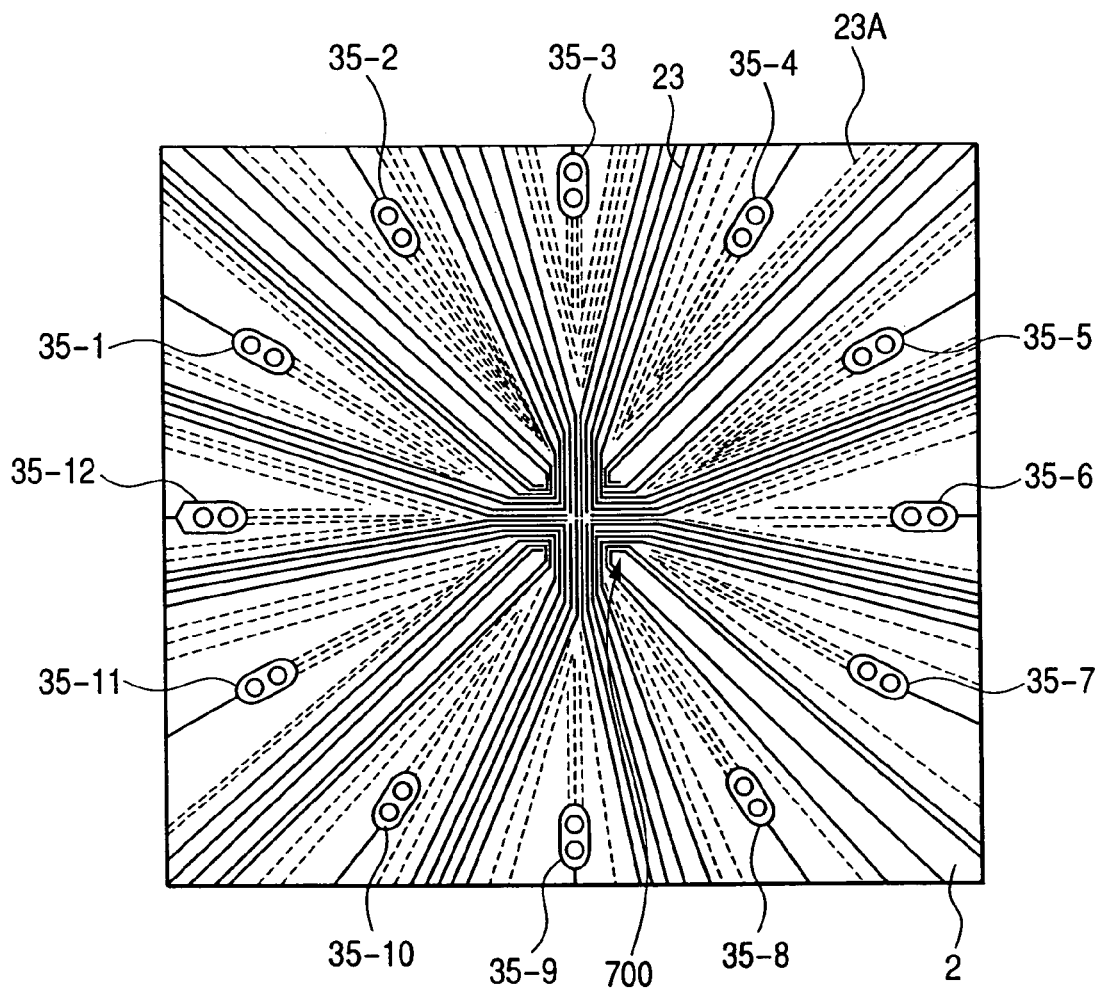
FIG. 35 is a plan view of the thin film sheet in the probe card of an Embodiment 4 of the invention.
Figure 36:
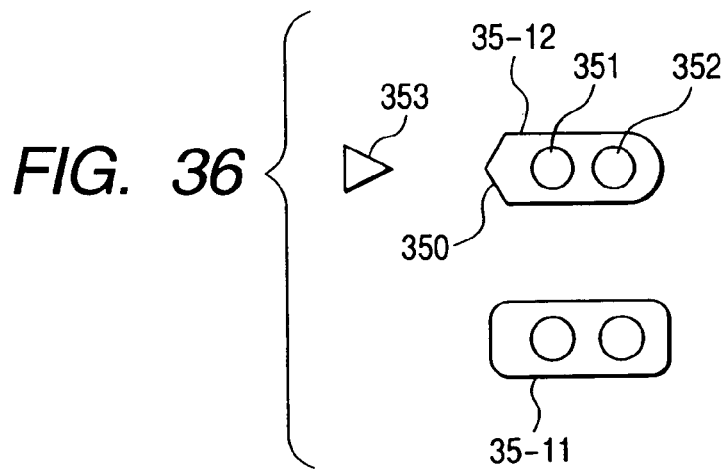
FIG. 36 is a plan view of the screw hole formation pattern in FIG. 35.

So, in Embodiment 4, in order to facilitate the positioning in the case of attachment of the thin film sheet 2, the screw hole formation pattern of the thin film sheet 2 is used. For example, as shown in FIG. 35, in the thin film sheet 2, two or more screw hole formation patterns 35-1 to 35-12 are formed in a position in contact with the hold-down ring 4 (refer to FIG. 1, FIG. 2, and FIG. 3). The elements indicated by 35-11 and 35-12 are expanded and shown in FIG. 36 as examples of two or more of these screw hole formation patterns 35-1 to 35-12. As thus clearly shown, the corner part 350 for positioning (mark for positioning) will be formed in the end only at the screw hole formation pattern 35-12. The direction of attachment of the thin film sheet 2 is pinpointed by this corner part 350. For example, the triangle mark 353 corresponding to the corner part 350 for the above-mentioned positioning is formed on the attachment side of the thin film sheet 2 in a wiring substrate 1. And, the thin film sheet 2 can be easily positioned relative to a wiring substrate 1 by uniting the above-mentioned corner part 350 for the positioning with the triangle mark 353. The thin film sheet 2 is pressed down by a hold-down ring 4 after this positioning. And, using the screw holes in the above-mentioned screw hole formation patterns 35-1 to 35-12, the thin film sheet 2 and the hold-down ring 4 are attached to a wiring substrate with a screw. The corner part 350 for the above-mentioned positioning is designed to be positioned at the edge-side of the thin film sheet 2, rather than according to the position of the screw hole 351. The edge-side of the thin film sheet 2, as opposed to the position of the screw hole 351, has a lower rigidity than the central part of the thin film sheet 2. Therefore, even if the corner part 350 for the above-mentioned positioning is formed, there is no fear of the thin film sheet 2 being torn by it.

In the thin film sheet 2, when two or more wirings 23 are formed so as to radiate outward toward the perimeter from the central part of the thin film sheet 2, a domain (non-wiring domain) in which wiring 23 is not formed tends to be created. By it, the rigidity balance in the thin film sheet 2 may collapse, and a tear in the thin film sheet 2 may be produced depending on the circumstances. So, it is good for the non-wiring domain of the thin film sheet 2 to secure a rigidity balance in the thin film sheet 2 by forming the dummy wiring 23A (a dashed line), which does not involve signal transfer.

Embodiment 5

Next, an Embodiment 5 of the present invention will be explained.

Figure 37:
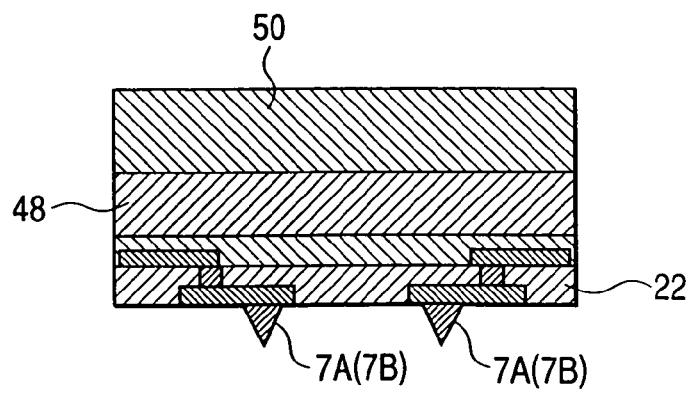
FIG. 37 is a sectional view of the thin film sheet in the probe card providing a comparison to the probe card of Embodiment 5 of the invention.
Figure 38:
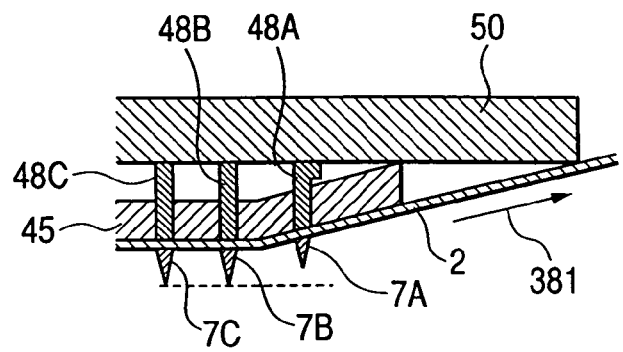
FIG. 38 is a sectional view of the thin film sheet in the probe card providing a comparison to the probe card of Embodiment 5 of the invention.

It is difficult to equalize the height of the probe 7A (7B) only by use of an elastomer 48 being stuck on the back of the thin film sheet 2, as shown in FIG. 37. The position of the probe 7A (7B) and the position of the pad may shift in this case under the influence of a thermal expansion coefficient. For this reason, in the above-mentioned Embodiment 1, a metal film (invar) 45 made of 42 Alloy having a thermal expansion coefficient near that of silicone is used. And, the probe 7A (7B) is pressed by the elastomer 48, which has an elasticity (refer to FIG. 29). However, as shown in FIG. 38, the tension 381 which extends to a border from the central part of the thin film sheet 2 works in the thin film sheet 2. Therefore, since the power which compresses the elastomer 48A located right above the outermost marginal probe 7A is added, a phenomenon is produced in which the contact reliability of the probe 7A in the rim falls.

Figure 39:
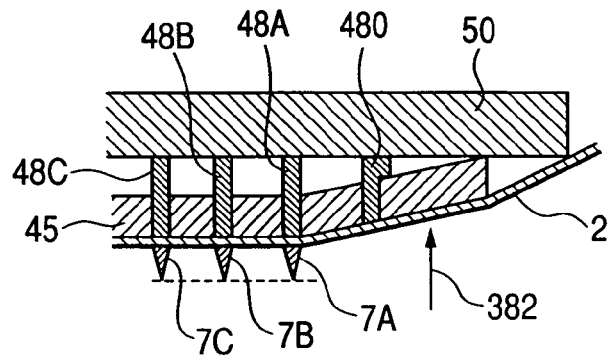
FIG. 39 is a sectional view of the thin film sheet in the probe card of Embodiment 5 of the invention.

Then, as shown in FIG. 39, the dummy elastomer 480 is formed near the outside of the above-mentioned outermost marginal probe 7A. In this case, although the dummy elastomer 480 is compressed in the direction of the arrow 382 by the tension working in the above-mentioned thin film sheet 2 and changes, it is possible to the possibility that the above-mentioned elastomer 48A will be compressed unintentionally. Thereby, the reliability of the probe is improved. If the width of the dummy elastomer 480 is too narrow, the dummy elastomer 480 will be lost by the tension of the thin film sheet 2 due to a shortage of the amount of elastomers. Then, for the width of the dummy elastomer 480, it is desirable to secure 300 μm or more in general.

Figure 40:
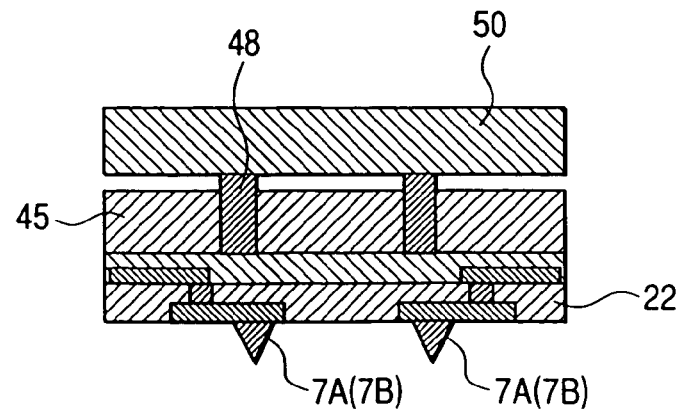
FIG. 40 is a sectional view of the thin film sheet in the probe card of Embodiment 5 of the invention.
Figure 41:
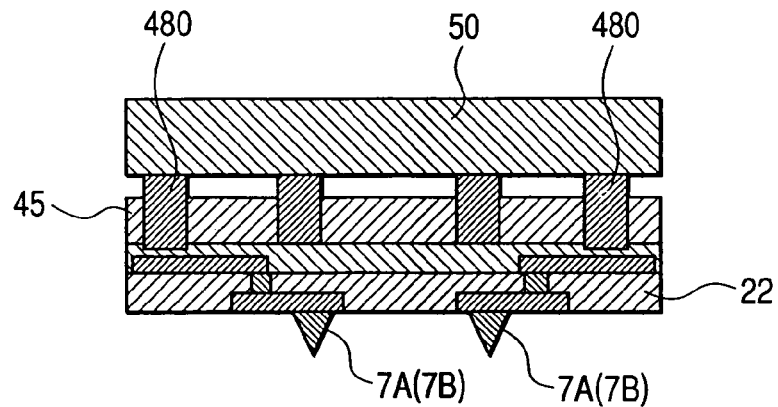
FIG. 41 is a sectional view of the thin film sheet in the probe card of Embodiment 5 of the invention.

As shown in FIG. 40, when the probes 7A (7B) are put side by side (refer to FIG. 9), it may be possible to provide a dummy elastomer on both sides, as shown in FIG. 41.

Figure 42:
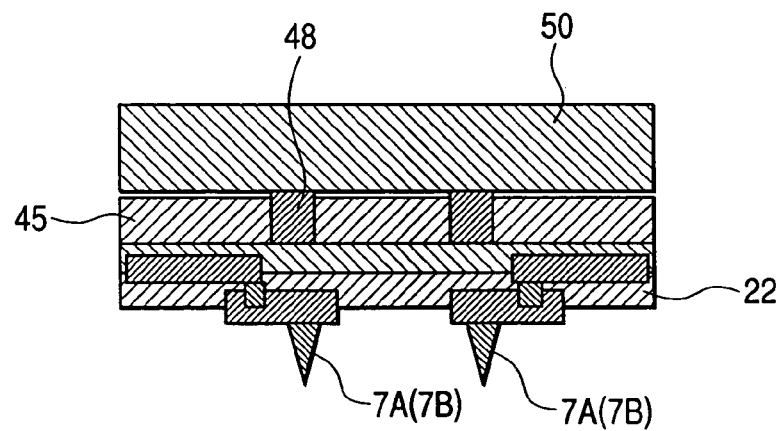
FIG. 42 is a sectional view of the thin film sheet in the probe card of Embodiment 5 of the invention.

As shown in FIG. 42, the height of an elastomer 48 is approximately the same as the thickness of a metal film (invar) 45, and both the elastomer 48 and the metal film (invar) 45 are pressed with a pressing tool 50. Then, deformation of the metal film (invar) 45, as shown in FIG. 38, is prevented, and it is possible to avoid the possibility that the above-mentioned elastomer 48A will be compressed unintentionally. And, improvement in the reliability of a probe can be aimed at. In this case, the element equivalent to the dummy elastomer 480 shown in FIG. 39 is made unnecessary.

Figure 43:
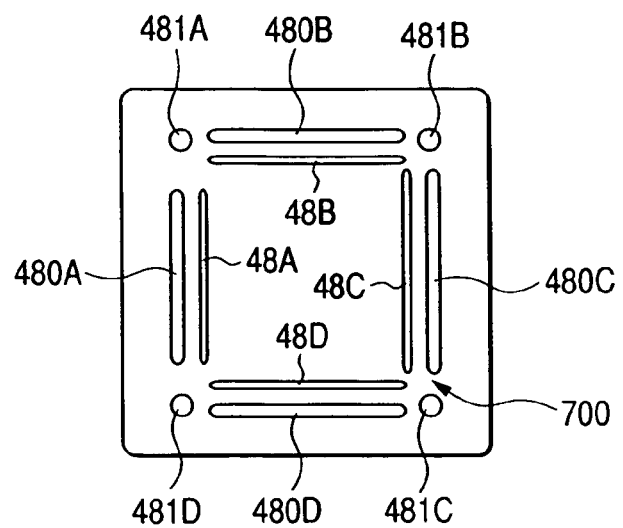
FIG. 43 is a plan view of the thin film sheet in the probe card of Embodiment 5 of the invention.
Figure 44:
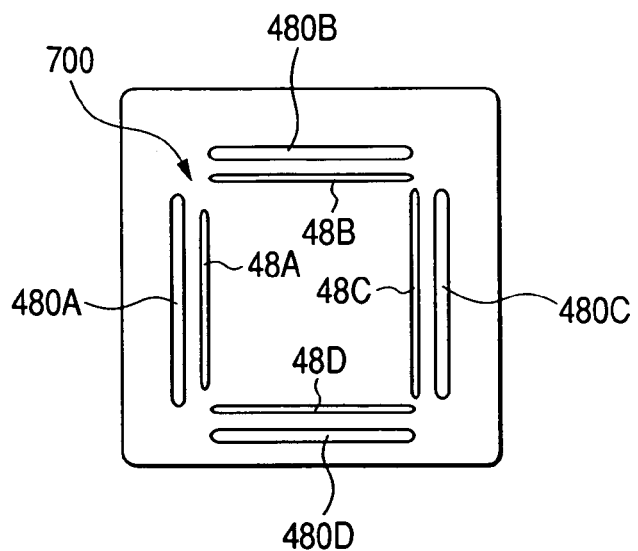
FIG. 44 is a plan view of the thin film sheet in the probe card of Embodiment 5 of the invention.

The elastomer corresponding to the position of a probe 7 is called a needle-root elastomer. As for the relation between this needle-root elastomer and a dummy elastomer, various modes can be considered according to the arrangement of the probe 7 etc., as shown in FIGS. 43-46. In FIG. 43, deformation of the needle-root elastomers 48A, 48B, 48C, and 48D is prevented by the fact that the needle-root elastomers 48A, 48B, 48C, and 48D are arranged in the shape of a rectangle corresponding to the probe arrangement of the probe formation domain 700 and by which the dummy elastomers 480A, 480B, 480C, and 480D are arranged so that they may be surrounded. When the chip size is large, it is good to form the circle-like dummy elastomers 481A, 481B, 481C, and 481D in the corner parts of the probe formation domain 700 to prevent deformation of the needle-root elastomers 48A, 48B, 48C, and 48D. Although the interval of the needle-root elastomers 48A, 48B, 48C, and 48D and the dummy elastomers 480A, 480B, 480C, and 480D corresponding thereto is not restricted in particular, it is set to 300 μm or more. At this time, the diameter of the circle-like dummy elastomers 481A, 481B, 481C, and 481D can be chosen in the range of 50-400 μm. Since the effect of the circle-like dummy elastomers 481A, 481B, 481C, and 481D cannot be expected when the chip size is comparatively small, the circle-like dummy elastomers 481A, 481B, 481C, and 481D all become unnecessary (refer to FIG. 44).

Figure 45:
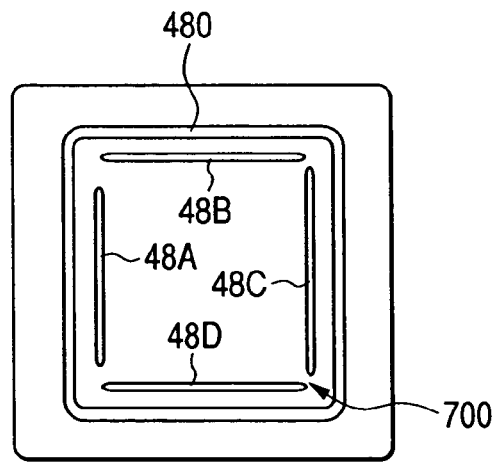
FIG. 45 is a plan view of the thin film sheet in the probe card of Embodiment 5 of the invention.
Figure 46:
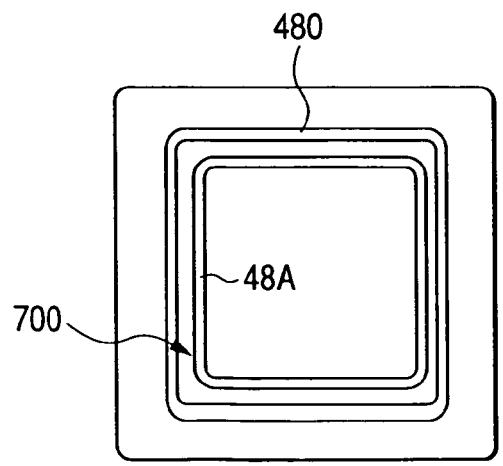
FIG. 46 is a plan view of the thin film sheet in the probe card of Embodiment 5 of the invention.

By combining the end of the above-mentioned dummy elastomers 480A, 480B, 480C, and 480D, as shown in FIG. 45, the dummy elastomer 480 may be formed in the shape of a rectangle. When the probe interval of the corner part in the probe formation domain 700 is 200 μm or less, as shown in FIG. 46, it is good to form both the needle-root elastomer 48 and the dummy elastomer 480 in the shape of a rectangle.

Figure 47:
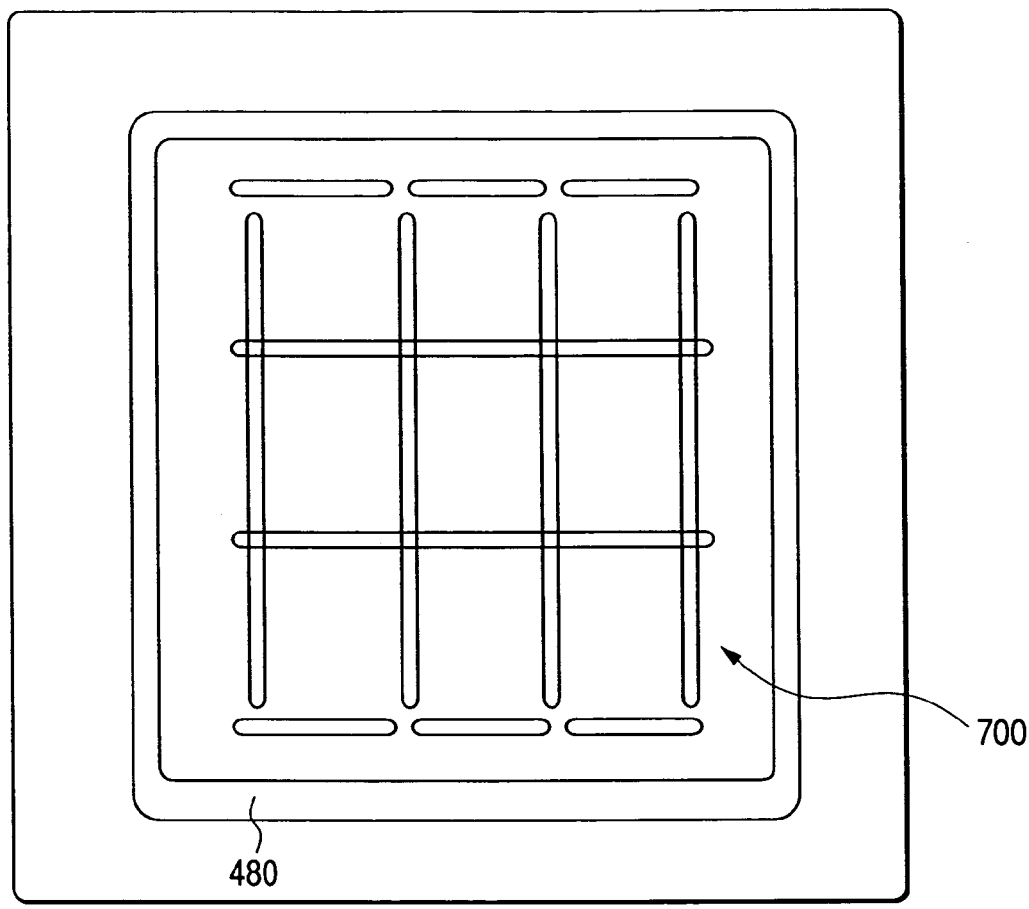
FIG. 47 is a plan view of the thin film sheet in the probe card of Embodiment 5 of the invention.

When measuring many chip regions on a wafer simultaneously, corresponding to the number of the chip regions set as the object of simultaneous measurement, two or more probe formation domains 700 are formed. At this time, a dummy elastomer is not formed for each probe formation domain 700, but, as shown in FIG. 47, it is good to form the dummy elastomer 480 so that two or more probe formation domains 700 that are formed corresponding to the number of the chip regions set as the object of simultaneous measurement may be surrounded.

Figure 48:
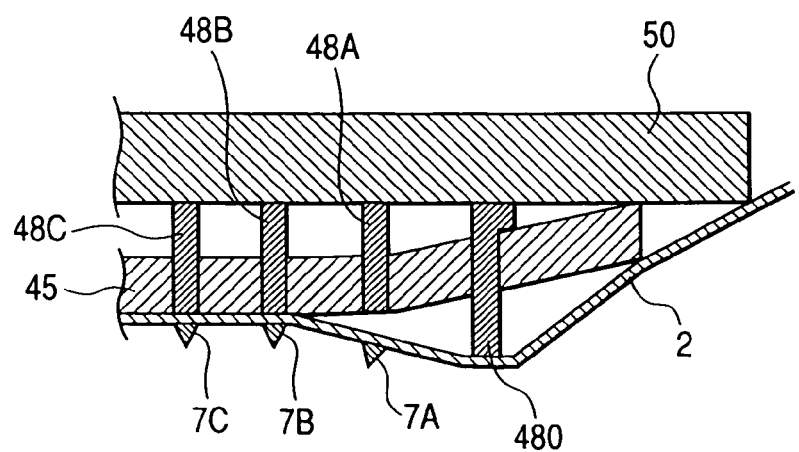
FIG. 48 is a sectional view of the thin film sheet in the probe card providing a comparison to the probe card of Embodiment 5 of the invention.

The subsidence of a probe is eased by the dummy elastomer as mentioned above. However, depending on the size of the dummy elastomer to be formed, it may produce an opposite effect. For example, as shown in FIG. 48, dummy elastomer 480 is pushed through the invar 45 due to the invar 45 being deformed by the tension working in the thin film sheet 2. When the amount of projection of this dummy elastomer 480 is large, it acts in such a way that the thin film sheet 2 may be pushed out. In this case, the probe 7A in that neighborhood projects out, which has a bad influence on the nature of the contact.

Figure 49:
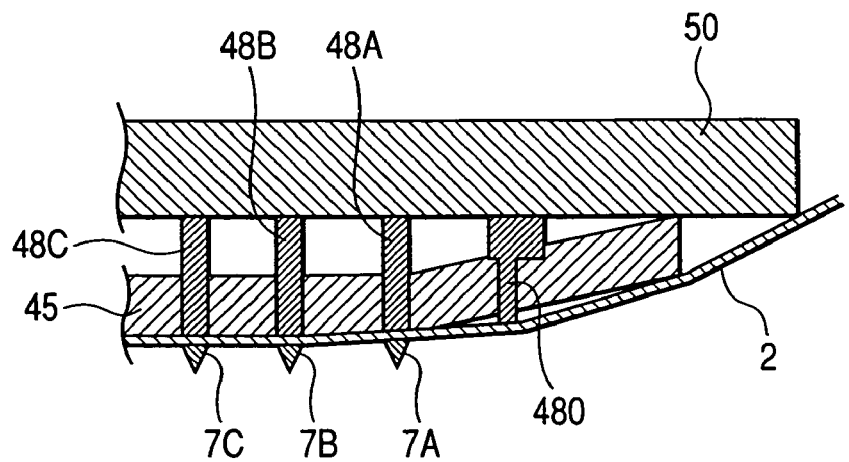
FIG. 49 is a plan view of the thin film sheet in the probe card of Embodiment 5 of the invention.
Figure 50:
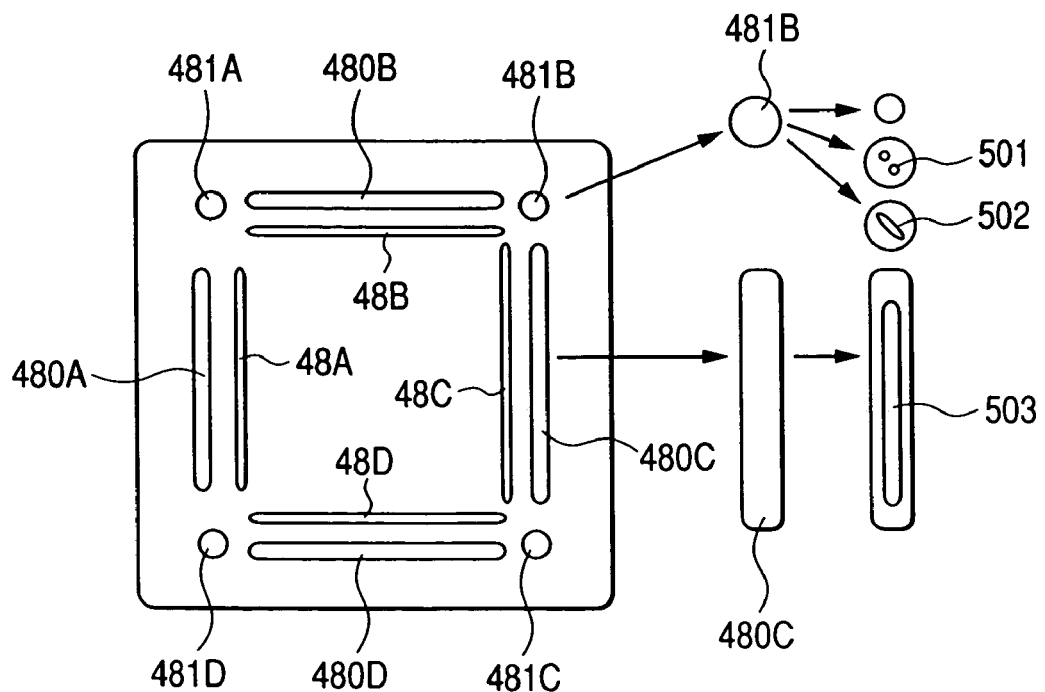
FIG. 50 is a plan view of the thin film sheet in the probe card of Embodiment 5 of the invention.

Thus, as shown in FIG. 49, in order to maintain the proper shape of the invar 45 where the dummy elastomer 480 is formed and to prevent a tension beyond necessity from working in the thin film sheet 2, by making the hole which accommodates the dummy elastomer 480 small or giving the inside of the dummy elastomer 480 a recessed portion, it is possible to adjust the power which resists the tension of the thin film sheet 2 of the dummy elastomer 480. For example, as shown in FIG. 50, concerning the circle-like dummy elastomers 481A-481D etc. of the corner part of the probe formation domain 700, with a means by which the diameter of the holes is made small, and also two or more small recesses 501 are formed, or by forming the recess 502 which extends from the front in an ellipse shape, the power which resists the tension of the thin film sheet 2 can be weakened.

Since the area of the thin film sheet 2 becomes large in proportion to the number of chip regions made into a simultaneous measurement object in measuring many chip regions on a wafer simultaneously, it is necessary to apply a big tension to the thin film sheet 2 compared with the case where the measuring object is one chip region. For this reason, it becomes difficult to suppress the invar deformation resulting from the tension working in the thin film sheet 2. The invar deformation resulting from the tension working in the thin film sheet 2 is especially made remarkable at the corner part of the probe formation domain 700.

Figure 51:
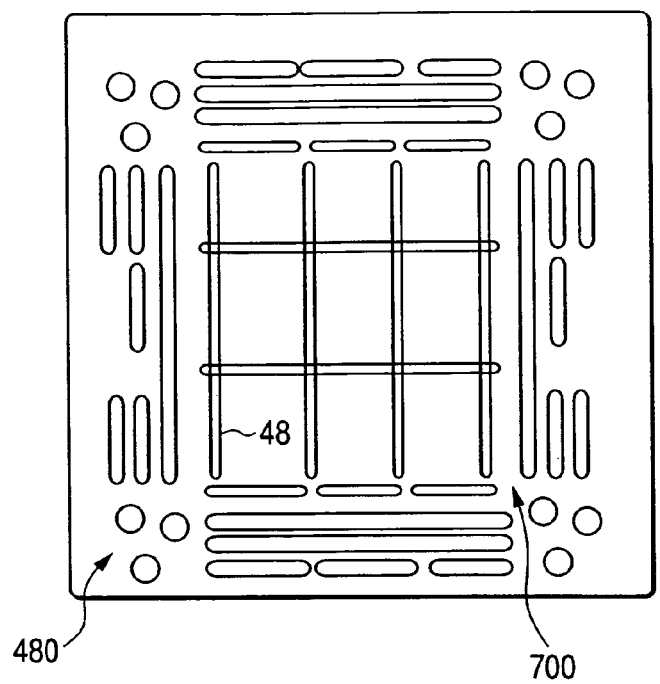
FIG. 51 is a plan view of the thin film sheet in the probe card of Embodiment 5 of the invention.

Therefore, as shown in FIG. 51, it is good to add a dummy elastomer primarily in the corner part of the probe formation domain 700.

Embodiment 6

Next, an Embodiment 6 of the present invention will be explained.

Figure 52:
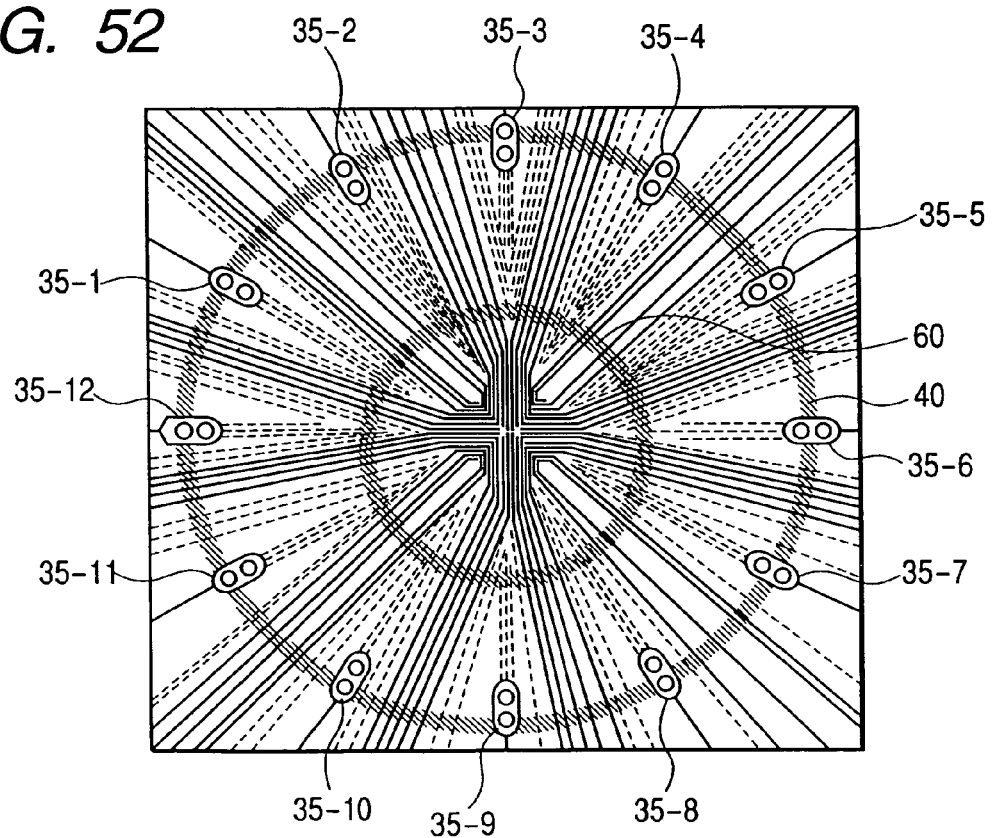
FIG. 52 is a plan view of the thin film sheet in the probe card of an Embodiment 6.
Figure 53:
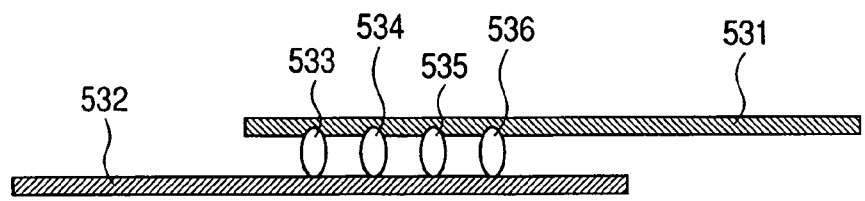
FIG. 53 is a sectional view in FIG. 52.

Since the number of signal wires in the thin film sheet 2 will increase if the number of input-and-output signals of a semiconductor integrated circuit increases, multilayer wiring is provided in the thin film sheet 2. When multilayer wiring is provided, a through-hole is provided as a means for effecting communication between mutually different wiring layers electrically. By the way, when the above-mentioned through-hole is provided in the part which has a strong tension in the thin film sheet 2, the possibility of producing a disconnection in a through-hole becomes high, and there is a possibility that the reliability of the multilayer wiring may by reduced. In FIG. 52, since an especially strong tension works between the domain 40 contacted by the hold-down ring 4 (refer to FIG. 1 and FIG. 2) and the domain 60 contacted by the adhesion ring 6 (refer to FIG. 1 and FIG. 2) in the thin film sheet 2, a through-hole should be formed in another place. That is, what is necessary is just to form a through-hole in the domain 40 that is contacted by the hold-down ring 4, its outside, the domain 60 contacted by the adhesion ring 6, and its inner side in the thin film sheet 2. In order to raise the certainty of connection then, as shown in FIG. 53, it is good in order to effect connection between the first wiring layer 531 and the second wiring layer 532 to use two or more through-holes 533-536. Thus, by determining the formation position and the number of through-holes, an improvement in the reliability of the multilayer wiring in the thin film sheet 2 can be achieved.

Embodiment 7

Next, an Embodiment 7 of the present invention will be explained.

Figure 54:
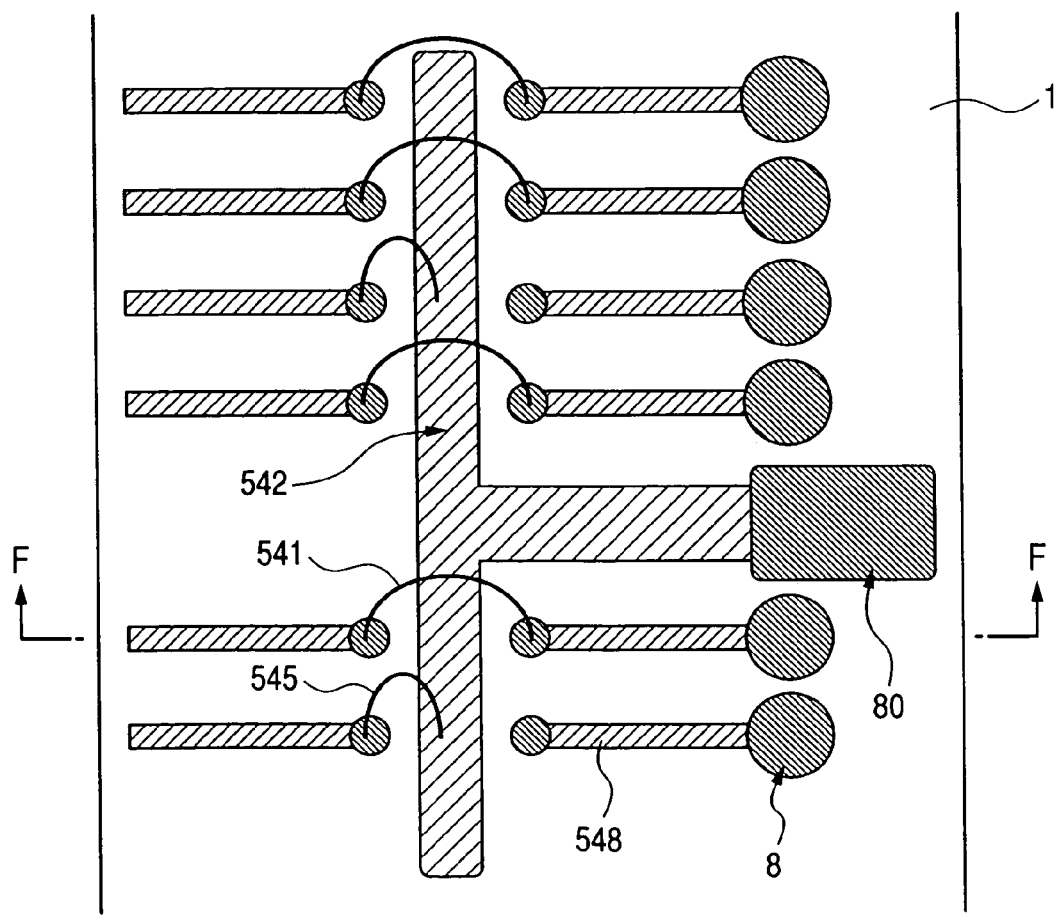
FIG. 54 is a plan view of the wiring substrate in the probe card providing a comparison to the probe card of an Embodiment 7 of the invention.
Figure 55:
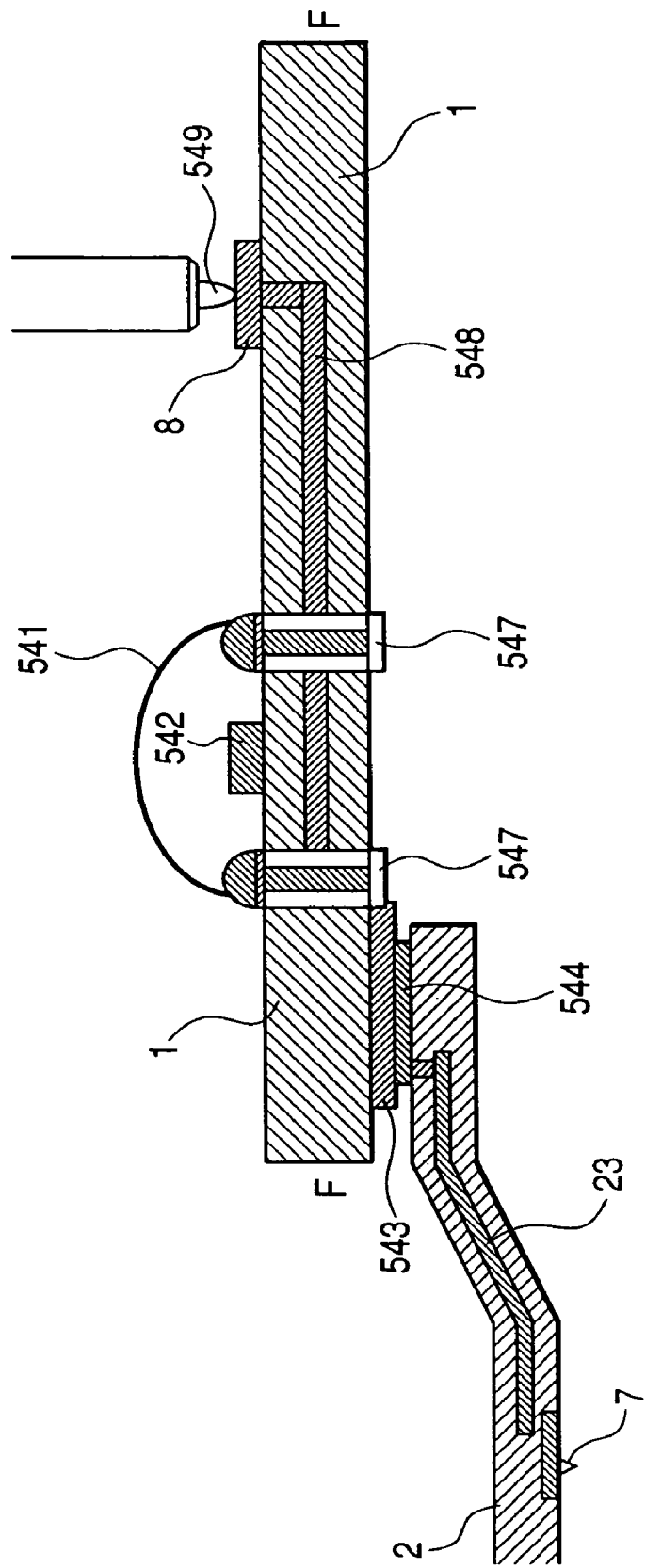
FIG. 55 is a sectional view taken along the line F-F in FIG. 54.

FIG. 54 is a plan view of a principal part in the wiring substrate 1 of the probe card showing a comparison to the Embodiment 7, and FIG. 55 is a sectional view taken along the line F-F in FIG. 54.

The end part 544 of the wiring 23 of the thin film sheet 2 is contacted by the pressure welding land 543 provided in the wiring substrate 1. This pressure welding land 543 is connected with the pogo-seat 8 via the through-hole 547, a jumper line 541, and the wiring 548 in the substrate. The pogo-seat 8 is connected with a tester (not shown) via the pogo-seat contact 549. A power supply wiring is connected with the power supply land 542 on a wiring substrate 1 via a jumper line 545. With this composition, since the general-purpose article was used as a wiring substrate 1, many jumper lines 541,545 exist on the wiring substrate 1. A pogo-seat and are not necessarily suitable pad in a semiconductor integrated circuit, and this leads to a need to reexamine the desirability to provide a jumper line 541,545 at every design of the thin film sheet 2.

Figure 56:
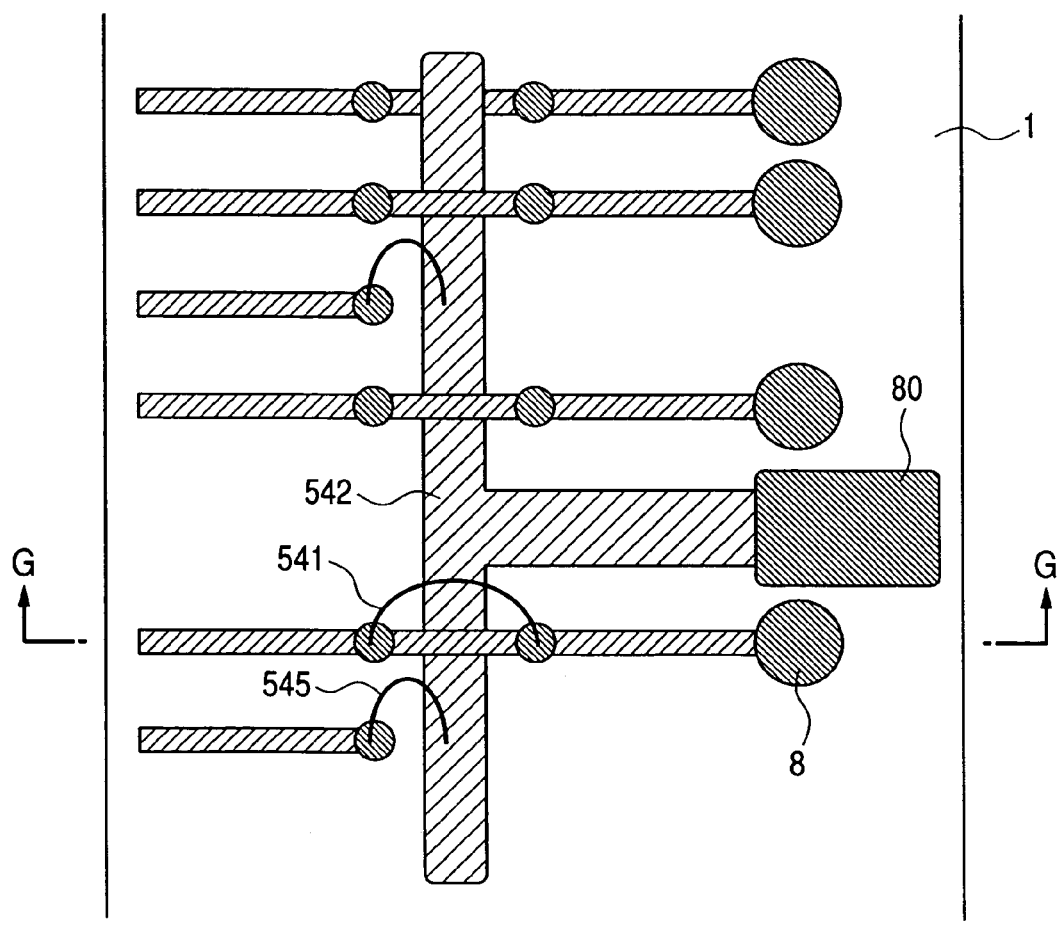
FIG. 56 is a plan view of the wiring substrate in the probe card of Embodiment 7.
Figure 57:
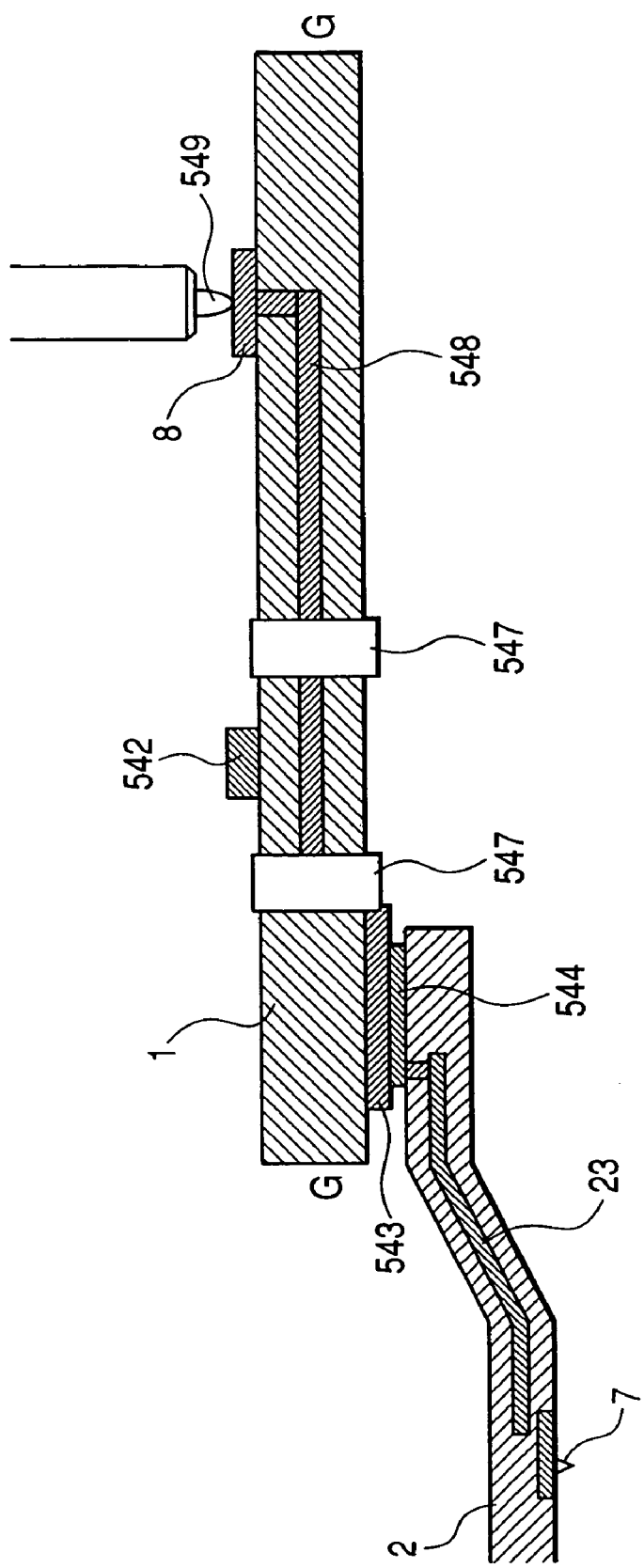
FIG. 57 is a sectional view taken along the line F-F in FIG. 56.
Figure 58:
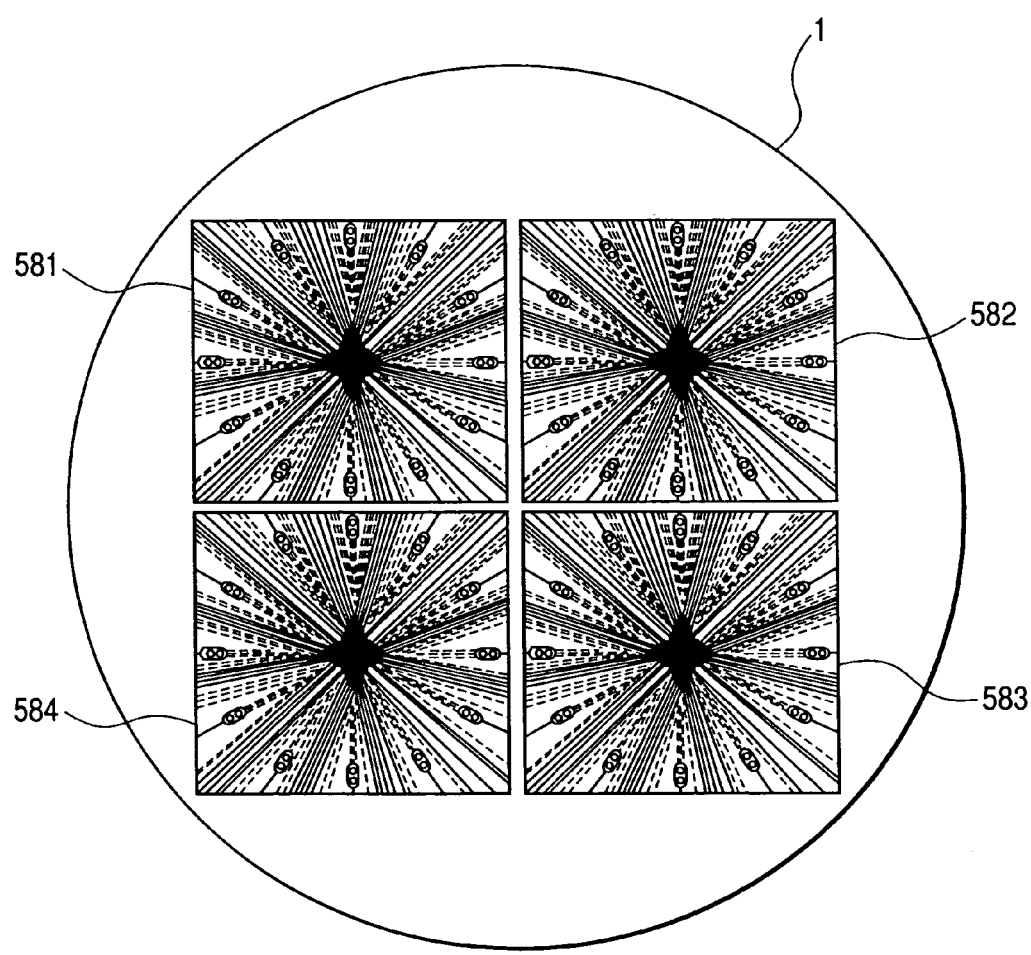
FIG. 58 is a plan view of the wiring substrate in the probe card of an Embodiment 8.
Figure 59:
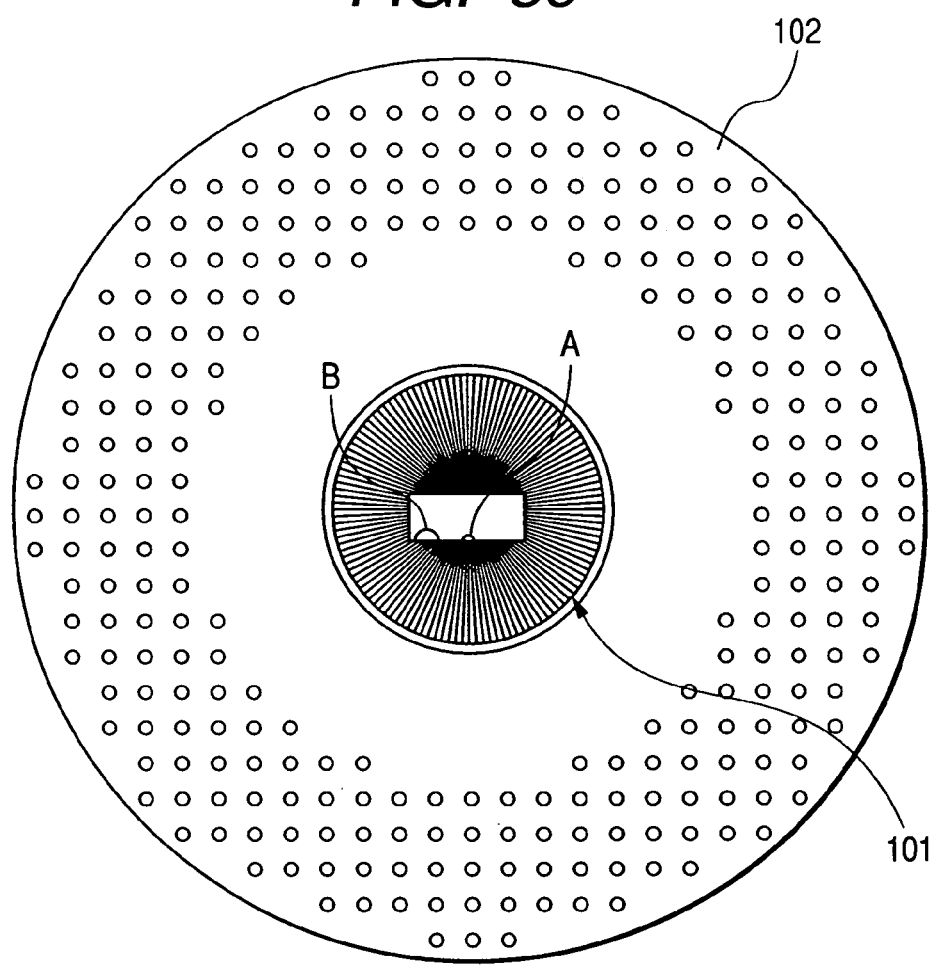
FIG. 59 is a plan view of a prober which the inventors have examined.
Figure 60:
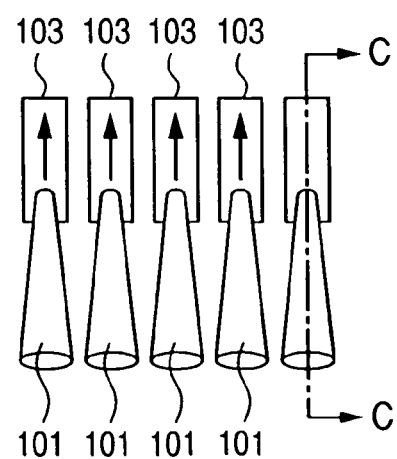
FIG. 60 is an enlarged plan view showing one domain in FIG. 59 in the probe testing step.
Figure 61:
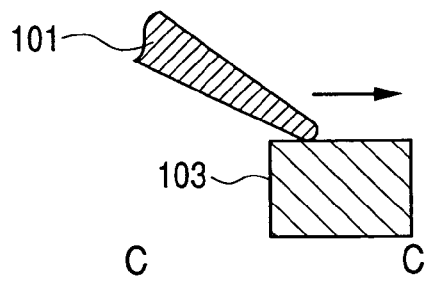
FIG. 61 is a sectional view taken along the line C-C in FIG. 60.
Figure 62:
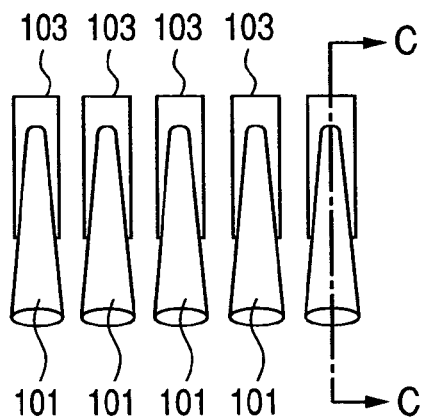
FIG. 62 is an enlarged plan view showing one domain in FIG. 59 in the probe testing step following the step of FIG. 60.
Figure 63:
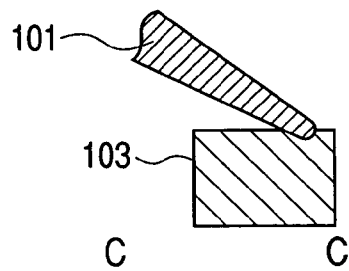
FIG. 63 is a sectional view taken along the line C-C in FIG. 62.
Figure 64:
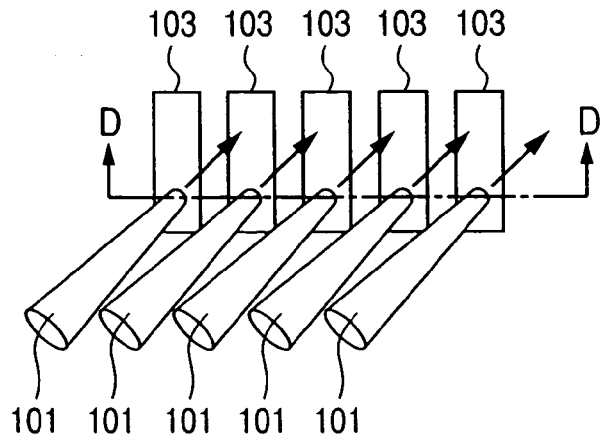
FIG. 64 is an enlarged plan view showing one domain in FIG. 59 in the probe testing step.
Figure 65:
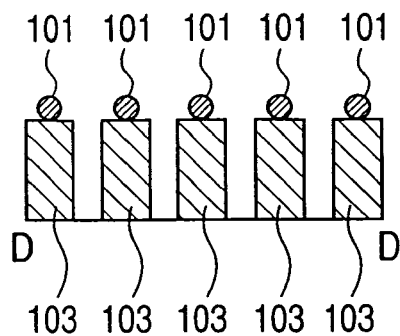
FIG. 65 is a sectional view taken along the line D-D in FIG. 64.
Figure 66:
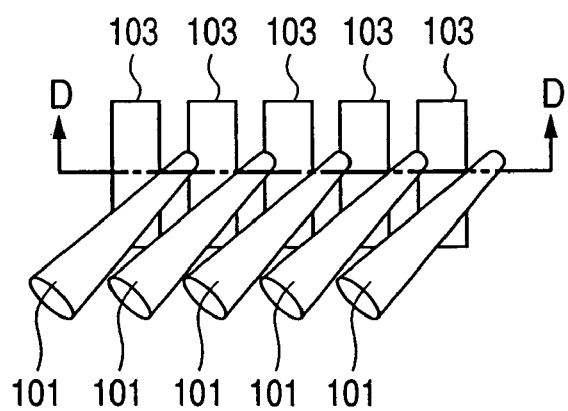
FIG. 66 is an enlarged plan view showing one domain in FIG. 59 in the probe testing step following the step of FIG. 64.
Figure 67:
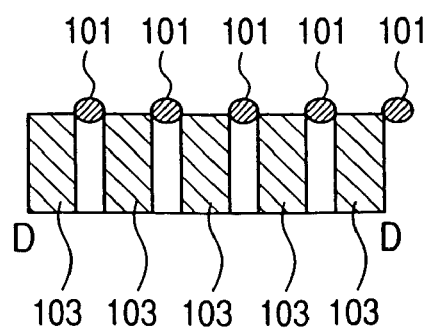
FIG. 67 is a sectional view taken along the line D-D in FIG. 66.

FIG. 56 is a plan view of the principal part in the wiring substrate 1 of the probe card of Embodiment 7, and FIG. 57 is a sectional view taken along the line G-G in FIG. 56.

The wiring 548 in a substrate for combining a pressure welding land and the pogo-seat 8 is formed regularly, and the jumper line is made unnecessary especially with regard to signal wiring. By the provision that a jumper line is unnecessary in the signal wiring, it becomes difficult to produce cross talk in the jumper line which mutually adjoins thereto, and the electrical property is improved.

Embodiment 8

Next, an Embodiment 8 of the present invention will be explained.

In Embodiment 8, in order to enable simultaneous testing two or more semiconductor integrated circuits (domain of a chip 10) which can be set to the wafer WH shown in FIG. 12, in the thin film sheet 1, two or more domains 581-584 in which the probe (contact terminal) was formed, respectively, are formed corresponding to two or more of the above-mentioned chip regions. According to this, probe testing can be simultaneously conducted at four chip regions. Since the description in Embodiments 1-7 has already considered the domains 581-584, a repeated explanation thereof is omitted.

As mentioned above, although the invention was concretely explained based on various embodiments, it cannot be overemphasized that this invention is not limited to these embodiments and it can change variously in a range which does not deviate from the gist thereof.

A bonding pad is sufficient as the electrode on the main surface of the semiconductor wafer made into a subject of testing besides a bump electrode.

This invention does not bar application of DFT technology or BIST technology.

The method of manufacturing a semiconductor integrated circuit device in accordance with this invention is widely applicable to, for example, the probe testing step in the manufacture of a semiconductor integrated circuit device.

What is claimed is:

1. A manufacturing method of a semiconductor integrated circuit device, comprising the steps of:
    (a) preparing a semiconductor wafer which has been divided in two or more chip regions each having a semiconductor integrated circuit formed thereover, and has, formed over the main surface of the wafer, two or more electrodes to be electrically connected to the semiconductor integrated circuit;
    (b) preparing a probe card which has two or more contact terminals which can contact the two or more electrodes; and
    (c) conducting electrical testing of the semiconductor integrated circuit, tips of the two or more contact terminals being contacted to the two or more electrodes;
    wherein the step (b) comprises the steps of:
    (b1) preparing, as opposed to a wiring substrate in which a first wiring is formed, a first sheet having the two or more contact terminals to contact the two or more electrodes; a second wiring electrically connected to the two or more contact terminals and the first wiring; and first dummy wirings which are near the formation domain of the two or more contact terminals, are arranged to a non-forming domain of the second wiring, and do not participate in signal transfer; and
    (b2) after the step (b1), attaching the first sheet over the wiring substrate in a state that a domain in which the two or more contact terminals are formed of the first sheet, can be pressed from a back of the first sheet.

2. The manufacturing method of a semiconductor integrated circuit device according to claim 1, wherein
    the two or more electrodes are arranged in two or more sequences along with the perimeter of the chip region; and
    the electrode contained in the first sequence and the electrode contained in the second sequence are alternately arranged in the direction in alignment with the perimeter of the chip region.

3. The manufacturing method of a semiconductor integrated circuit device according to claim 2, wherein
    the dummy wirings include a wiring formed in a shape of radiation toward a part corresponding to the electrode array part from a central part of the first sheet.

* * * * *